United States Patent
Shin et al.

(10) Patent No.: US 11,887,692 B2
(45) Date of Patent: Jan. 30, 2024

(54) ELECTRONIC DEVICE, OPERATION METHOD OF HOST, OPERATION METHOD OF MEMORY MODULE, AND OPERATION METHOD OF MEMORY DEVICE

(71) Applicant: SAMSUNG ELECTRONICS CO., LTD., Suwon-si (KR)

(72) Inventors: Wonjae Shin, Seoul (KR); Nam Hyung Kim, Suwon-si (KR); Dae-Jeong Kim, Seoul (KR); Do-Han Kim, Hwaseong-si (KR); Deokho Seo, Suwon-si (KR); Insu Choi, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 27 days.

(21) Appl. No.: 17/535,861

(22) Filed: Nov. 26, 2021

(65) Prior Publication Data

US 2022/0366949 A1    Nov. 17, 2022

(30) Foreign Application Priority Data

May 14, 2021   (KR) .......................... 10-2021-0062719

(51) Int. Cl.
*G11C 7/22* (2006.01)
*G11C 7/10* (2006.01)
*G11C 8/18* (2006.01)

(52) U.S. Cl.
CPC ............ *G11C 7/222* (2013.01); *G11C 7/1009* (2013.01); *G11C 7/109* (2013.01); *G11C 7/1063* (2013.01); *G11C 8/18* (2013.01)

(58) Field of Classification Search
CPC ...................................................... G11C 7/22

USPC ....................................................... 365/233.1
See application file for complete search history.

(56) References Cited

U.S. PATENT DOCUMENTS

| | | | |
|---|---|---|---|
| 4,779,232 A | 10/1988 | Fukunaka et al. | |
| 6,459,651 B1 | 10/2002 | Lee et al. | |
| 6,718,444 B1 | 4/2004 | Hughes | |
| 8,122,204 B2 * | 2/2012 | Nagao | G11C 11/406 365/220 |
| 9,117,035 B2 | 8/2015 | Shaeffer et al. | |
| 9,892,772 B2 | 2/2018 | Song | |
| 9,911,477 B1 * | 3/2018 | Teh | H03K 19/1776 |

(Continued)

FOREIGN PATENT DOCUMENTS

WO    WO2018039855 A1    3/2018

OTHER PUBLICATIONS

Examination Report dated Oct. 17, 2022 From the European Patent Officecited in Corresponding European Patent Application.

*Primary Examiner* — Muna A Techane
(74) *Attorney, Agent, or Firm* — Fish & Richardson P.C.

(57) ABSTRACT

An operation method of a memory device, having a plurality of memory cells, includes receiving a partial write command, which includes a partial write enable signal (PWE) and a plurality of mask signals, during a command/address input interval. A data strobe signal is received through a data strobe line after receiving the partial write command Data is received through a plurality of data lines in synchronization with the data strobe signal during a data input interval. A part of the data is stored in the plurality of memory cells based on the plurality of mask signals, in response to the partial write enable signal, during a data write interval.

10 Claims, 20 Drawing Sheets

(56) References Cited

U.S. PATENT DOCUMENTS

| | | |
|---|---|---|
| 10,510,398 B2 * | 12/2019 | Penney ................ G11C 7/1093 |
| 10,635,357 B2 | 4/2020 | Halfen |
| 2005/0108460 A1 | 5/2005 | David |
| 2008/0177931 A1 | 7/2008 | Isaac et al. |
| 2009/0196107 A1 | 8/2009 | Ogasawara et al. |
| 2010/0064100 A1 * | 3/2010 | Bains ................ G06F 13/4243 |
| | | 711/E12.083 |
| 2019/0005997 A1 | 1/2019 | Shaeffer |
| 2020/0012453 A1 * | 1/2020 | Halfen ................ G06F 3/0659 |

* cited by examiner

US 11,887,692 B2

ELECTRONIC DEVICE, OPERATION METHOD OF HOST, OPERATION METHOD OF MEMORY MODULE, AND OPERATION METHOD OF MEMORY DEVICE

CROSS-REFERENCE TO RELATED APPLICATIONS

This application claims priority under 35 U.S.C. § 119 to Korean Patent Application No. 10-2021-0062719 filed on May 14, 2021, in the Korean Intellectual Property Office, the disclosure of which is incorporated by reference herein in its entirety.

BACKGROUND

Embodiments of the present disclosure described herein relate to a semiconductor memory, and more particularly, relate to an electronic device, an operation method of a host, an operation method of a memory module, and an operation method of a memory device.

A semiconductor memory device is classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

There is required a read or write request of a unit (e.g., a nibble unit or a byte unit) smaller than a cache line unit. A partial write operation or a partial read operation may be performed by using a data mask function.

SUMMARY

Embodiments of the present disclosure provide an electronic device, an operation method of a host, an operation method of a memory module, and an operation method of a memory device, which are capable of supporting a partial write operation and minimizing power consumption.

According to an embodiment, an operation method of a memory device, having a plurality of memory cells, includes receiving a partial write command including a partial write enable signal and a plurality of mask signals, during a command/address input interval. A data strobe signal is received through a data strobe line after receiving the partial write command A plurality of data is received through a plurality of data lines in synchronization with the data strobe signal, during a data input interval. A part of the plurality of data is stored in the plurality of memory cells based on the plurality of mask signals, in response to the partial write enable signal, during a data write interval.

According to an embodiment, an operation method of a memory module which includes a plurality of memory devices includes receiving a partial write command including a partial write enable signal and a plurality of mask signals, at a first time. A first data strobe signal toggling through a first data strobe line connected with a first memory device among the plurality of memory devices is received. A second data strobe signal that is maintained at logic high is received through a second data strobe line connected with a second memory device among the plurality of memory devices, during a strobe toggle interval after the first time. A plurality of data is received through a plurality of data lines, during a data input interval after the first time.

According to an embodiment, an operation method of a host which is connected with a memory module includes generating second data by adding dummy data to first data of a unit smaller than a cache line unit. A partial write command including a partial write enable signal (PWE) and a plurality of mask signals is output to the memory module, during a command/address input interval. A data strobe signal is output to the memory module during a data strobe toggle interval, after the command/address input interval. The second data is output to the memory module through a plurality of data lines during a data input interval, after the command/address input interval.

According to an embodiment, an electronic device includes a memory interface circuit that outputs a partial write command including a partial write enable signal and a plurality of mask signals through a command/address line and outputs first data including dummy data through a plurality of data lines. A memory device receives the partial write command through the command/address line, receives the first data through the plurality of data lines, and stores a part of the first data in a memory cell based on the plurality of mask signals.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Figure 1:
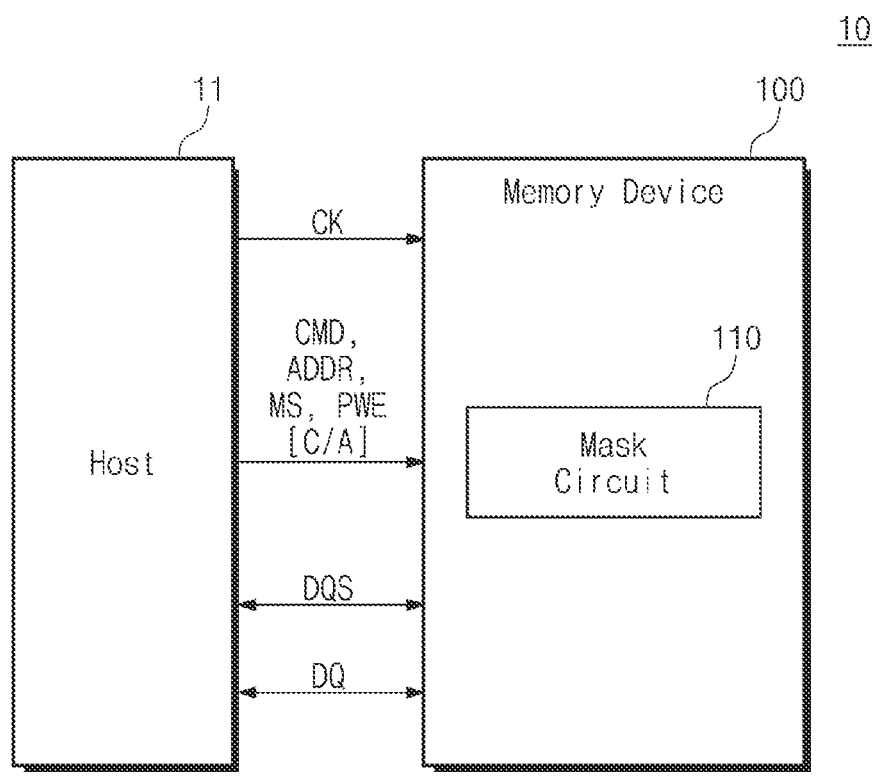
FIG. 1 is a block diagram illustrating a memory system, according to an embodiment of the present disclosure.

FIG. 1 is a block diagram illustrating a memory system, according to an embodiment of the present disclosure. Referring to FIG. 1, a memory system 10 may include a host 11 and a memory device 100. The host 11 may send an address and a command to the memory device 100 for the purpose of storing data in the memory device 100 or reading data stored in the memory device 100. For example, the host 11 may be a central processing unit (CPU) or a memory controller.

In an embodiment, an address may include a row address RA, a column address CA, a bank address BA, a bank group address BG, a chip identifier (ID) "C", etc., and a command may include an active command ACT, a write command WR, a partial write command PWR, a read command RD, a precharge command PRE, etc. However, the present disclosure is not limited thereto. For example, the address and the command may include various types of addresses and commands In an embodiment, the host 11 may send a clock signal CK and a command/address signal C/A to the memory device 100. The host 11 may exchange data with the memory device 100 through a plurality of data lines DQ. The host 11 may exchange a data strobe signal DQS with the memory device 100.

As an embodiment, the host 11 may communicate with the memory device 100 based on a high-speed interface such as a double data rate (DDR) interface. However, the present disclosure is not limited thereto. For example, the host 11 may communicate with the memory device 100 based on at least one of various communication interfaces such as a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a Firewire interface, a universal flash storage (UFS) interface, and a nonvolatile memory express (NVMe) interface.

In an embodiment, the host 11 may send a partial write request to the memory device 100. The host 11 may send the partial write command PWR to the memory device 100 through the command/address signal C/A. During a command/address input interval, the host 11 may output a partial write enable signal PWE and a plurality of mask signals MS to the memory device 100 through the command/address signal C/A.

Under control of the host 11, the memory device 100 may store data received from the host 11 or may provide data stored therein to the host 11. For example, the memory device 100 may receive the clock signal CK from the host 11. The memory device 100 may receive a command CMD, an address ADDR, the partial write enable signal PWE, the plurality of mask signals MS from the host 11 through the command/address signal C/A. In response to the received signals, the memory device 100 may send data to the host 11 through the plurality of data lines DQ and the data strobe signal DQS or may receive data from the host 11 through the plurality of data lines DQ and the data strobe signal DQS.

In an embodiment, the memory device 100 may include a dynamic random access memory (DRAM). However, the present disclosure is not limited thereto. For example, the memory device 100 may include at least one of various memory devices such as a static RAM (SRAM), a dynamic RAM (DRAM), a synchronous DRAM (SDRAM), a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), etc.

Below, to describe the technical idea of the present disclosure easily, it is assumed that the memory device 100 is a dynamic random access memory (DRAM) and the host 11 and the memory device 100 communicate with each other based on a double data rate (DDR) interface.

In an embodiment, the memory device 100 may include a mask circuit 110. The mask circuit 110 may receive the data strobe signal DQS, the partial write enable signal PWE, and the plurality of mask signals MS. The mask circuit 110 may store a part of a plurality of data received through the plurality of data lines DQ in a plurality of memory cells, based on the data strobe signal DQS, the partial write enable signal PWE, and the plurality of mask signals MS.

As described above, during the command/address input interval, the memory device 100 may receive the partial write enable signal PWE and the plurality of mask signals MS from the host 11 through the command/address signal C/A. A configuration and an operation method of the mask circuit 110 will be more fully described with reference to the following drawings.

Figure 2A:
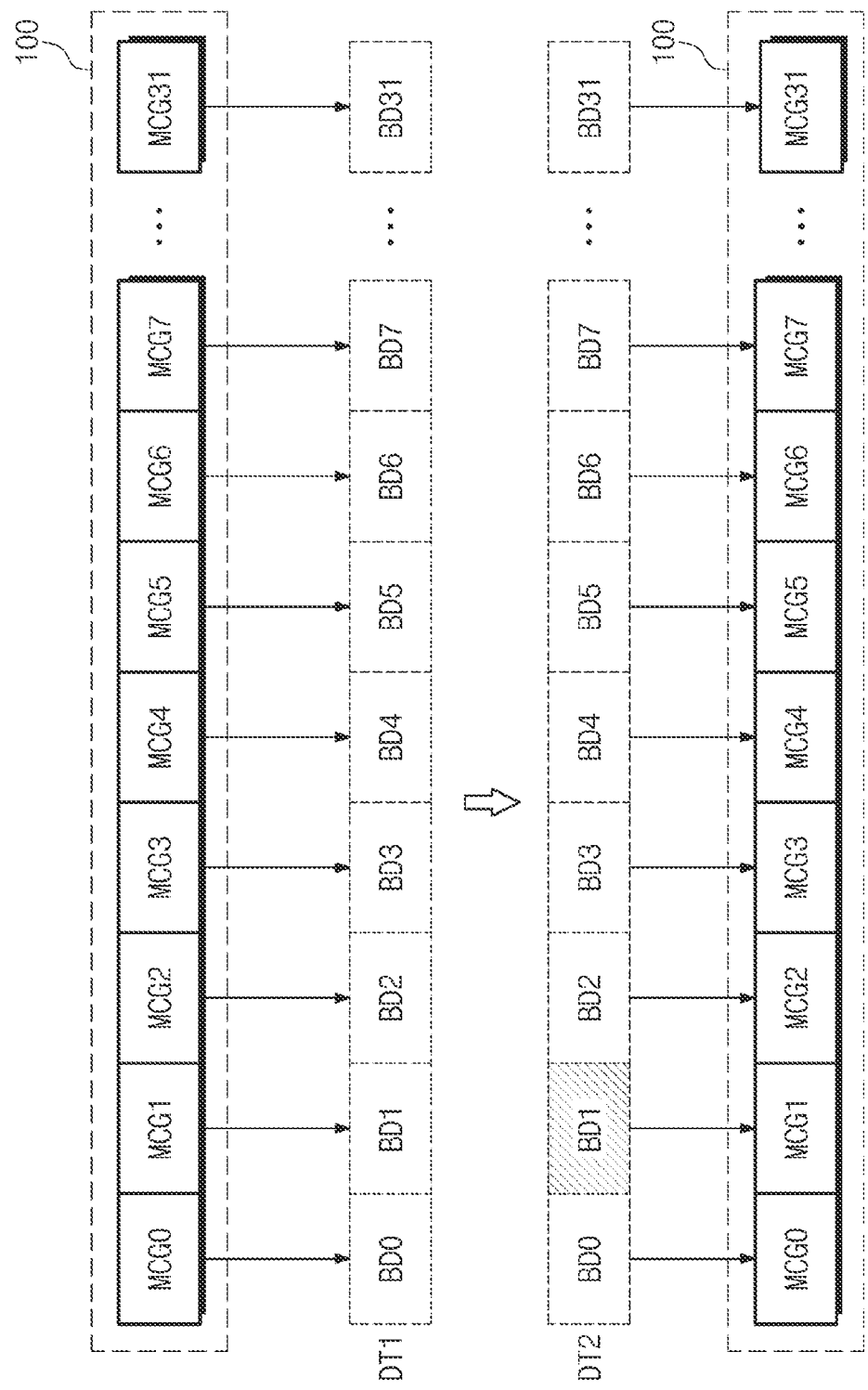
FIGS. 2A and 2B are diagrams illustrating an operation of the memory system of FIG. 1.
Figure 2B:
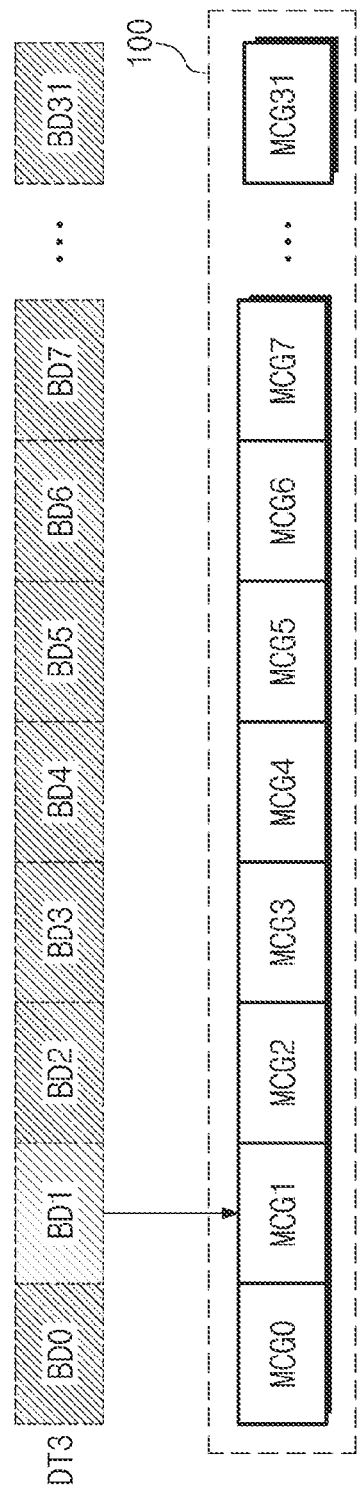

FIGS. 2A and 2B are diagrams illustrating an operation of the memory system 10 of FIG. 1. A cache line may refer to a minimum access unit according to a read or write request that the host 11 sends to the memory device 100. A size of each of cache lines may be, for example, 32 bytes or 64 bytes. A conventional memory system may access a memory device in units of cache line. As such, to update data of a byte unit, the memory system may perform a read operation in units of cache line and may then perform a write operation in units of cache line.

It is assumed that a cache line is 32 bytes in size. The memory device 100 may include 0-th to thirty-first memory cell groups MCG0 to MCG31. For example, each of the memory cell groups MCG0 to MCG31 may include 8 memory cells.

Each of first and second data DT1 and DT2 may include 0-th to thirty-first byte data BD0 to BD31. For example, each of the byte data BD0 to BD31 may be 8 bits in size. It is assumed that a value of the first byte data BD1 of the first data DT1 and a value of the first byte data BD1 of the second data DT2 are different and values of the remaining byte data BD0 and BD2 to BD31 of the first data DT1 are equal to values of the remaining byte data BD0 and BD2 to BD31 of the second data DT2.

The host 11 may store the first data DT1 corresponding to a first address in the memory device 100. For example, the host 11 may store each of values of the 0-th to thirty-first byte data BD0 to BD31 in a corresponding memory cell group. For example, the host 11 may store a value of the 0-th byte data BD0 in the 0-th memory cell group MCG0, may store a value of the first byte data BD1 in the first memory cell group MCG1, may store a value of the second byte data BD2 in the second memory cell group MCG2, and may store a value of the third byte data BD3 in the third memory cell group MCG3. As in the above description, values of the remaining byte data BD4 to BD31 are stored in the remaining memory cell groups MCG4 to MCG31, and thus, additional description will be omitted to avoid redundancy.

The host 11 may update data stored in the first memory cell group MCG1. That is, the host 11 may change data corresponding to the first address. To update data stored in the first memory cell group MCG1, the host 11 may read data corresponding to the first address, which are stored in the memory device 100. For example, the host 11 may read the first data DT1 stored in the 0-th to thirty-first memory cell groups MCG0 to MCG31 from the memory device 100.

For example, the memory device 100 may read the value of the 0-th byte data BD0 of the first data DT1 from the 0-th memory cell group MCG0, may read the value of the first byte data BD1 of the first data DT1 from the first memory cell group MCG1, may read the value of the second byte data BD2 of the first data DT1 from the second memory cell group MCG2, and may read the value of the third byte data BD3 of the first data DT1 from the third memory cell group MCG3. As in the above description, values of the remaining byte data BD4 to BD31 of the first data DT1 are read from the remaining memory cell groups MCG4 to MCG31, and thus, additional description will be omitted to avoid redundancy.

The host 11 may generate the second data DT2 based on the first data DT1. To update data stored in the first memory cell group MCG1, the host 11 may generate the second data DT2 corresponding to a cache line unit. The host 11 may generate the second data DT2 by updating the first byte data BD1 of the first data DT1. That is, the value of the first byte data BD1 of the first data DT1 and a value of the first byte data BD1 of the second data D2 may be different, and the values of the remaining byte data BD0 and BD2 to BD31 of the first data DT1 may be equal to the values of the remaining byte data BD0 and BD2 to BD31 of the second data DT2.

The host 11 may store the second data DT2 in the memory device 100. For example, the host 11 may send a write request and the second data DT2 to the memory device 100. The write request may include a write command and the first address. The memory device 100 may store the second data DT2 in a plurality of memory cells in response to the write request. The memory device 100 may store the value of the 0-th byte data BD0 of the second data DT2 in the 0-th memory cell group MCG0, may store a value of the first byte data BD1 of the second data DT2 updated in the first memory cell group MCG1, may store the value of the second byte data BD2 of the second data DT2 in the second memory cell group MCG2, and may store the value of the third byte data BD3 of the second data DT2 in the third memory cell group MCG3. As in the above description, the values of the remaining byte data BD4 to BD31 of the second data DT2 are stored in the remaining memory cell groups MCG4 to MCG31, and thus, additional description will be omitted to avoid redundancy.

As described above, to update data of a byte unit stored in the first memory cell group MCG1, the host 11 may read the first data DT1 corresponding to the cache line unit from the memory device 100 and may store or write the second data DT2 corresponding to the cache line unit in the memory device 100.

A memory device may support a partial write operation through a data mask (DM) function DM. According to the protocol of the DDR 4.0 specification, an X8/X16 memory device may perform a data mask function, a data bus inversion (DBI) function, and a TDQS function through a DM_n/DBI_n/TDQS_t signal. The data mask function, the data bus inversion function, and the TDQS function may be enabled or disabled by setting a mode register. However, an X4 memory device fails to use the DM_n/DBI_n/TDQS_t signal. The X4 memory device does not support the data mask function.

As such, to update data of a unit (e.g., a nibble unit or a byte unit) smaller than the cache line unit, which are stored in the X4 memory device, a memory system needs to read data corresponding to the cache line unit from the X4 memory device and to write data corresponding to the cache line unit in the X4 memory device.

A memory device according to an embodiment of the present disclosure may perform a partial write operation regardless of the number of DQ lines. The memory device 100 may receive a partial write enable signal and a plurality of mask signals by using command/address lines, not the DM_n/DBI_n/TDQS_t signal.

A memory device that uses the data mask function may receive a data mask signal from a host during a data input interval. In contrast, a memory device according to an embodiment of the present disclosure may receive a plurality of mask signals during a command/address input interval.

A method of updating data corresponding to a byte unit will be described with reference to FIG. 2B. Compared to FIG. 2A, the memory system 10 according to an embodiment of the present disclosure may perform the partial write operation. For example, the memory system 10 may write data, the unit of which is smaller than the cache line unit, in the memory device 100. As such, to perform an update operation, the memory system 10 may not read the first data DT1 corresponding to the cache line unit from the memory device 100.

For example, the host 11 may update data stored in the first memory cell group MCG1. Through the partial write operation, the host 11 may write data of a unit smaller than the cache line unit in the memory device 100.

Third data DT3 may include the 0-th to thirty-first byte data BD0 to BD31. It is assumed that the first byte data BD1 have a valid value and the remaining byte data BD0 and BD2 to BD31 have a dummy value.

The host 11 may generate the third data DT3. The third data DT3 may include the first byte data BD1 having the valid value and the 0-th and second to thirty-first byte data BD0 and BD2 to BD31 each having the dummy value. That is, the data corresponding to 0-th and second to thirty-first memory cell groups MCG0 and MCG2 to MCG31 may be dummy data and the data corresponding to the first memory cell group MCG1 may be the first byte data BD1 updated. For example, the dummy data may refer to a given data pattern or a random data pattern.

The host 11 may send the partial write request and the third data DT3 to the memory device 100. For example, the partial write request may include a partial write command and an address.

The memory device 100 may receive the partial write request and the third data DT3. The memory device 100 may perform the partial write operation in response to the partial write request. The memory device 100 may write, in the first memory cell group MCG1, only the first byte data BD1 except for the dummy data.

As described above, the memory system 10 according to an embodiment of the present disclosure may perform the partial write operation. As such, to update data of a smaller unit than the cache line unit, the memory system 10 may not read data corresponding to the cache line unit from the memory device 100. The host 11 may send updated byte data and dummy data to the memory device 100 such that data of a smaller unit than the cache line unit, that is, the updated byte data are written in the memory device 100.

Figure 3:
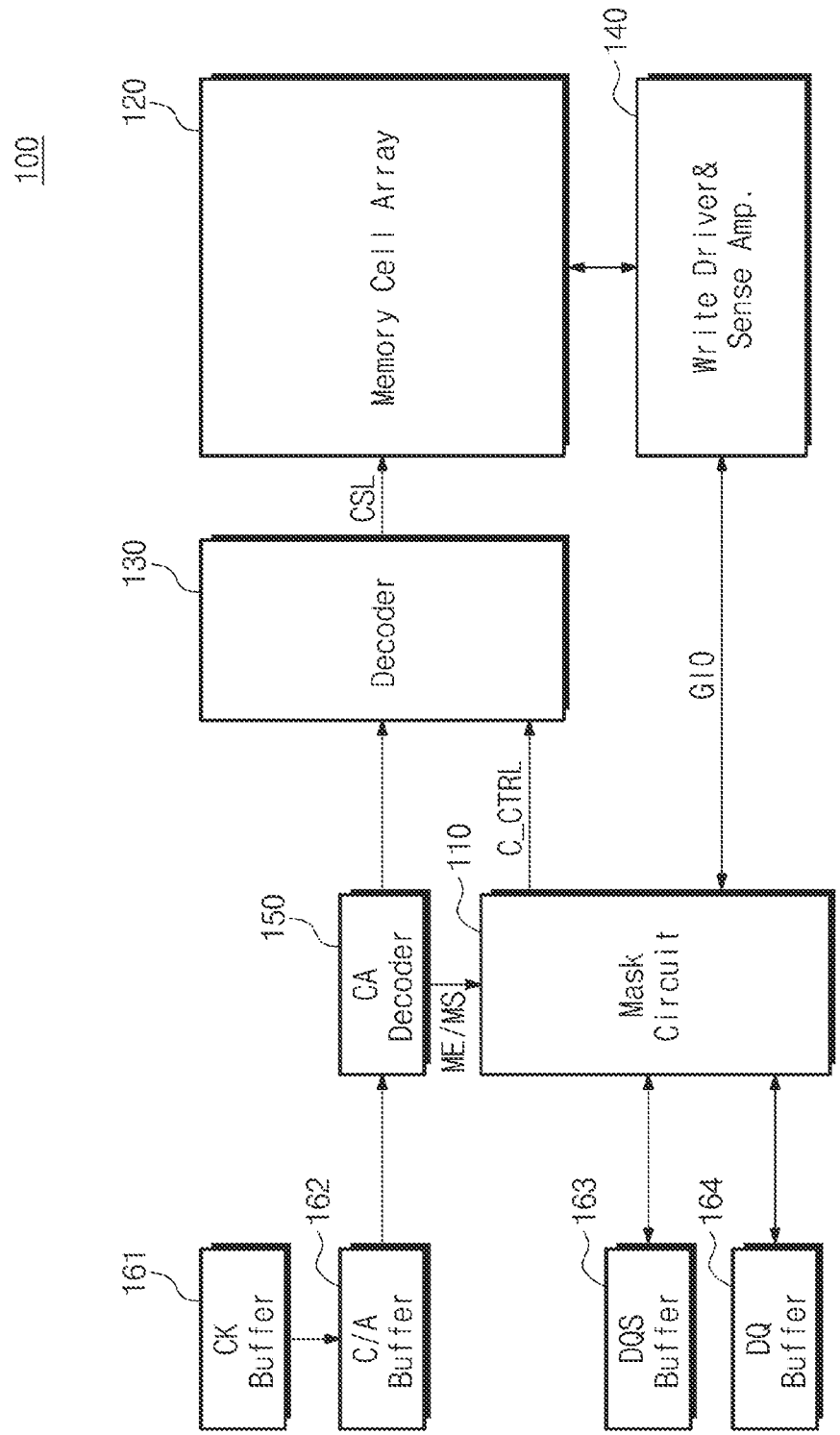
FIG. 3 is a block diagram illustrating a memory device of FIG. 1.

FIG. 3 is a block diagram illustrating a memory device of FIG. 1. Referring to FIGS. 1 and 3, the memory device 100 may include the mask circuit 110, a memory cell array 120, a decoder 130, a write driver and sense amplifier 140, a command/address decoder 150, and buffer circuits 161 to 164.

The memory cell array 120 may include a plurality of memory cells connected with wordlines (not illustrated) and bitlines (not illustrated). Under control of the decoder 130 and the write driver and sense amplifier 140, each of the plurality of memory cells may be configured to store data or to output the stored data.

The decoder 130 may control the plurality of memory cells included in the memory cell array 120. The decoder 130 may control the plurality of memory cells based on information (e.g., a decoding result) received from the command/address decoder 150. For example, the decoder 130 may decode the row address RA to enable a word line corresponding to the row address RA. The decoder 130 may decode the column address CA to enable a column selection line CSL corresponding to the column address CA.

In an embodiment, the decoder 130 may receive a column control signal C_CTRL from the mask circuit 110. The decoder 130 may control the column selection line CSL in response to the column control signal C_CTRL. The decoder 130 may set the column selection line CSL to logic low "L" in response to the column control signal C_CTRL such that all or a part of input data is not stored in the memory cell array 120. The decoder 130 may set the column selection line CSL to logic high "H" in response to the column control signal C_CTRL such that all or a part of input data is stored in the memory cell array 120.

The write driver and sense amplifier 140 may be configured to write data in the plurality of memory cells included in the memory cell array 120 or to output data stored in the plurality of memory cells included in the memory cell array 120.

The command/address decoder 150 may decode the command/address signal C/A received through the command/address buffer 162. The command/address decoder 150 may provide a decoding result to the decoder 130. The command/address decoder 150 may decode a clock enable signal CKE, a chip select signal CS_n, an active signal ACT_n, a row address strobe (RAS) signal RAS_n, a column address strobe (CAS) signal CAS_n, a write enable signal WE_n, and the partial write enable signal PWE to identify the partial write command PWR.

The partial write command PWR may be defined through the write command WR and the partial write enable signal PWE. Based on a result of decoding the clock enable signal CKE, the chip select signal CS_n, the active signal ACT_n, the RAS signal RAS_n, the CAS signal CAS_n, and the write enable signal WE_n, the command/address decoder 150 may identify the write command WR and may identify the partial write enable signal PWE indicating an enable state. As a result, the command/address decoder 150 may identify the partial write command PWR.

The command/address decoder 150 may output a mask enable signal ME and a plurality of mask signals MS to the mask circuit 110 in response to the clock enable signal CKE, the chip select signal CS_n, the active signal ACT_n, the RAS signal RAS_n, the CAS signal CAS_n, the write enable signal WE_n, and the partial write enable signal PWE. That is, when receiving the partial write command PWR, the command/address decoder 150 may provide the mask enable signal ME and the plurality of mask signals MS to the mask circuit 110. The mask enable signal ME may be a signal for enabling an internal mask function such that the partial write operation is performed.

For example, the mask enable signal ME may have a first logical value (e.g., logic low "L") indicating a disable state or a second logical value (e.g., logic high "H") indicating the enable state. As such, when the partial write enable signal PWE indicates the enable state, the command/address decoder 150 may set the mask enable signal ME to logic high "H". As such, when the partial write enable signal PWE indicates the disable state, the command/address decoder 150 may set the mask enable signal ME to logic low "L".

The clock buffer 161 may receive the clock signal CK from the host 11. The memory device 100 may operate based on the received clock signal CK.

The command/address buffer 162 may receive the command/address signal C/A from the host 11 through command/address lines. The command/address signal C/A may be transferred through the clock enable signal CKE, the chip select signal CS_n, the active signal ACT_n, the RAS signal RAS_n, the CAS signal CAS_n, the write enable signal WE_n, bank group address lines BG0 and BG1, bank address lines BA0 and BA1, chip identifier lines C0 to C2, a twelfth address line A12, eleventh, thirteenth, and seventeenth address lines A11, A13, and A17, a tenth address line A10, and 0-th to ninth address lines A0 to A9.

For example, the memory device 100 may receive a bank group address BG from the host 11 through the bank group address lines BG0 and BG1, may receive a bank address BA from the host 11 through the bank address lines BA0 and BA1, and may receive the column address CA from the host 11 through the 0-th to ninth address lines A0 to A9.

In an embodiment, the command/address buffer 162 may receive the partial write enable signal PWE through the twelfth address line A12. The command/address buffer 162 may receive a 0-th mask signal MS0 through the 0-th address line A0, may receive a first mask signal MS1 through the first address line A1, may receive a second mask signal MS2 through the second address line A2, may receive a third mask signal MS3 through the eleventh address line A11, may receive a fourth mask signal MS4 through the thirteenth address line A13, may receive a fifth mask signal MS5 through the 0-th chip identifier line C0, may receive a sixth mask signal MS6 through the first chip identifier line C1, and may receive a seventh mask signal MS7 through the second chip identifier line C2.

The command/address buffer 162 may provide the command/address signal C/A thus received to the command/address decoder 150.

The DQS buffer 163 may receive the data strobe signal DQS from the host 11 through a data strobe line. The memory device 100 may detect input data by sampling, capturing, or parallelizing data by using the data strobe signal DQS. The DQ buffer 164 may receive the input data from the host 11 through the plurality of data lines DQ. The DQ buffer 164 may provide the input data to the mask circuit 110. For example, input data Din may indicate data that are received by the memory device 100 during the data input interval.

In an embodiment, in the case where a burst length is 8 (BL8), the DQ buffer 164 may receive the input data Din. The input data Din may include 0-th input data Din_0 transferred to the plurality of data lines DQ during a 0-th burst length, first input data Din_1 transferred to the plurality of data lines DQ during a first burst length, second input data Din_2 transferred to the plurality of data lines DQ during a second burst length, and third input data Din_3 transferred to the plurality of data lines DQ during a third burst length. The remaining input data Din_4 to Din_7 have a structure similar to that described above, and thus, additional description will be omitted to avoid redundancy.

The mask circuit 110 may receive the mask enable signal ME and the plurality of mask signals MS from the command/address decoder 150. The mask circuit 110 may receive the data strobe signal DQS from the DQS buffer 163. The mask circuit 110 may receive the input data Din, which are received through the plurality of data lines DQ, from the DQ buffer 164. The mask circuit 110 may provide the input data Din to the write driver and sense amplifier 140 through a global input/output line GIO.

The mask circuit 110 may perform the partial write operation or the internal mask operation in response to the mask enable signal ME. The partial write operation refers to an operation of performing a masking operation such that data are not written in a part of memory cell groups (or blocks) of the memory cell array 120 in a write operation.

In an embodiment, when the mask enable signal ME indicates the enable state, the mask circuit 110 may perform the partial write operation based on the plurality of mask signals MS0 to MS7 and the data strobe signal DQS. For example, the mask circuit 110 may not transfer a part of the input data Din to the write driver and sense amplifier 140 based on the plurality of mask signals MS0 to MS7. Alternatively, the mask circuit 110 may control the column control signal C_CTRL based on the plurality of mask signals MS0 to MS7 such that a part of the input data Din is not stored in memory cells. The mask circuit 110 may output the column control signal C_CTRL to the decoder 130.

In an embodiment, when the partial write enable signal PWE indicates the enable state, the mask circuit 110 may determine whether the data strobe signal DQS maintains logic high "H" during a strobe toggle interval. When the data strobe signal DQS maintains logic high "H" during the strobe toggle interval, the mask circuit 110 may not transfer the whole input data Din to the write driver and sense amplifier 140. Alternatively, the mask circuit 110 may control the column control signal C_CTRL such that the whole input data Din are not stored in memory cells.

Figure 4:
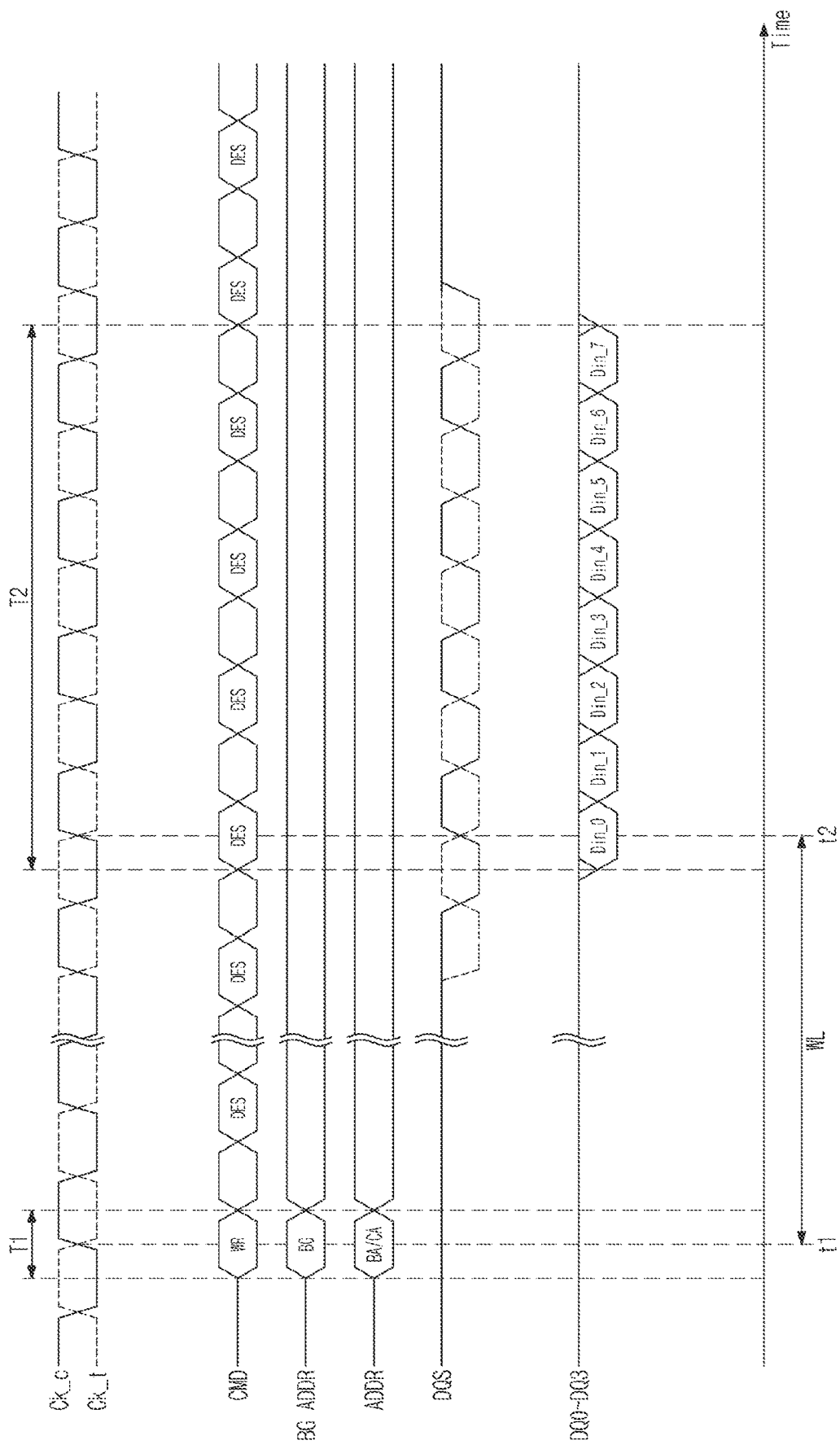
FIG. 4 is a timing diagram for describing a write operation of a memory system of FIG. 1.

FIG. 4 is a timing diagram for describing a write operation of a memory system of FIG. 1. The write operation will be described with reference to FIGS. 1 and 4. The memory system 10 may perform the write operation based on the timing diagram illustrated in FIG. 4.

At a first time t1 (or at a first rising edge of a clock signal Ck_c), the host 11 may send a command and an address to the memory device 100. The host 11 may send the write command WR through a command signal (e.g., CMD). The host 11 may send the bank group address BG through a bank group address line (e.g., BG ADDR). The host 11 may send the bank address BA and the column address CA through an address line (e.g., ADDR).

In an embodiment, after a write latency WL passes from the time t1 at which the write command and the address are sent, the input data Din may be sent through the data lines DQ (e.g., DQ0-DQ3) in synchronization with the data strobe signal DQS toggling.

In an embodiment, during a command/address input interval T1, the memory device 100 may receive the command and the address from the host 11. After the write latency WL passes from the time t1 at which the write command and the address are sent, the memory device 100 may receive the input data Din from the host 11 during a data input interval T2.

In an embodiment, Table 1 and Table 2 below show an example of a command truth table, which is based on the protocol of the DDR 4.0 specification. In Table 2, "H" indicates a high level or logic high, and "L" indicates a low level or logic low. "V" indicates a specific level defined as one of "H" and "L".

TABLE 1

| CKE Previous Cycle | CKE Current Cycle | CS_n | ACT_n | RAS_n | CAS_n | WE_n |
|---|---|---|---|---|---|---|
| H | H | L | H | H | L | L |

The write command WR may be sent by controlling the clock enable signal CKE, the chip select signal CS_n, the active signal ACT_n, the RAS signal RAS_n, the CAS signal CAS_n, and the write enable signal WE_n as shown in Table 1. For example, at the first time t1, the host 11 may send the write command WR by setting the clock enable signal CKE to logic high "H" in a previous cycle and a current cycle, setting the chip select signal CS_n to logic low "L", setting the active signal ACT_n to logic high "H", setting the RAS signal RAS_n to logic high "H", setting the CAS signal CAS_n to logic low "L", and setting the write enable signal WE_n to logic low "L".

TABLE 2

| BG0-BG1 | BA0-BA1 | C0-C2 | A12 | A17, A13, A11 | A10 | A0-A9 |
|---|---|---|---|---|---|---|
| BG | BA | V | V | V | V | CA |

As understood from Table 2 above, at the first time t1, the host 11 may send the bank group address BG to the memory device 100 through the 0-th and first bank group address lines BG0 and BG1 and may send the bank address BA to the memory device 100 through the 0-th and first bank address lines BA1 and BA1. The host 11 may send a burst chopping signal BC to the memory device 100 through the twelfth address line A12. The burst chopping signal BC may indicate that a portion of a burst length defined in advance or separately is not used. The host 11 may send an auto precharge signal AP through the tenth address line A10. The host 11 may send the column address CA through the 0-th to ninth address lines A0 to A9. At the first time t1, the host 11 may set the 0-th to second chip identifier lines C0 to C2, the tenth to thirteenth and seventeenth address lines A10, A11, A12, A13, and A17 to a level corresponding to one of logic high "H" or logic low "L".

Figure 5:
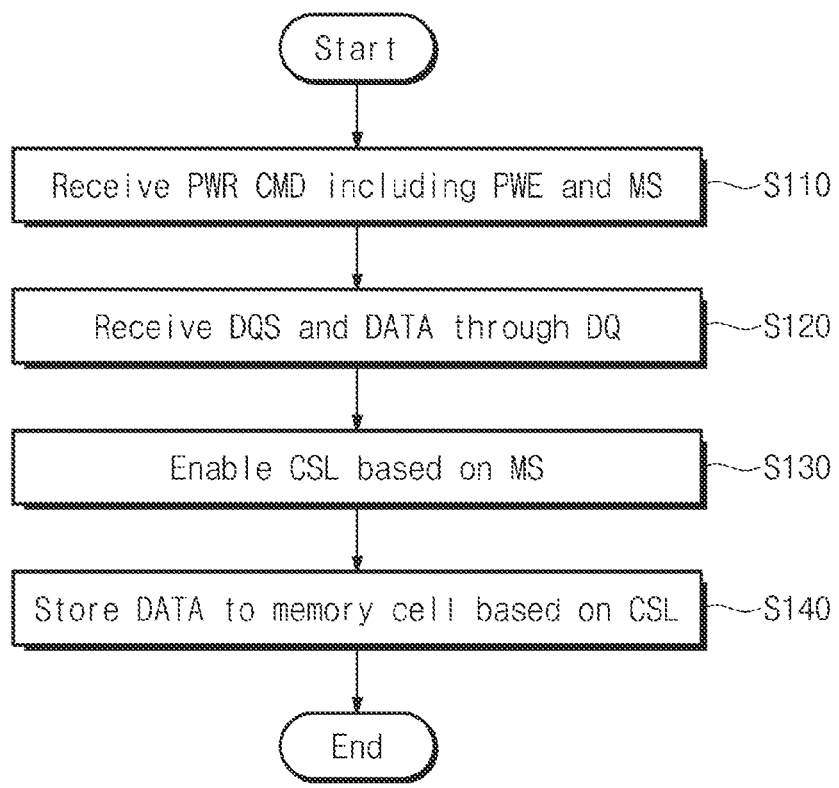
FIG. 5 is a flowchart illustrating a partial write operation of a memory device of FIG. 1.

FIG. 5 is a flowchart illustrating a partial write operation of a memory device of FIG. 1. Referring to FIGS. 1 and 5, in operation S110, the memory device 100 may receive the partial write command PWR including the partial write enable signal PWE and the plurality of mask signals MS from the host 11. For example, during the command/address input interval, the memory device 100 may receive the partial write command PWR through the command/address signal C/A.

In operation S120, the memory device 100 may receive the data strobe signal DQS during the strobe toggle interval.

The memory device 100 may receive data through the plurality of data lines DQ during the data input interval.

In operation S130, the memory device 100 may enable a column selection line based on the plurality of mask signals MS. For example, when a mask signal indicates the disable state, the memory device 100 may enable a column selection line corresponding to a column address of input data corresponding to the mask signal. When a mask signal indicates the enable state, the memory device 100 may disable a column selection line corresponding to a column address of input data corresponding to the mask signal.

In operation S140, the memory device 100 may store the data in a plurality of memory cells based on the column selection line CSL. For example, when a column selection line indicates the enable state, the memory device 100 may store input data corresponding to the column selection line in memory cells. For another example, when a column selection line indicates the disable state, the memory device 100 may store input data corresponding to the column selection line in memory cells. That is, the memory device 100 store a part of input data in memory cells based on the plurality of mask signals MS, in response to the partial write enable signal PWE, during a data write interval (e.g., S130, S140).

As described above, the memory device 100 may receive the plurality of mask signals MS through the command/address signal C/A, not a separate data mask signal DM_n. The memory device 100 may receive the plurality of mask signals MS during the command/address input interval, not the data input interval.

Figure 6:
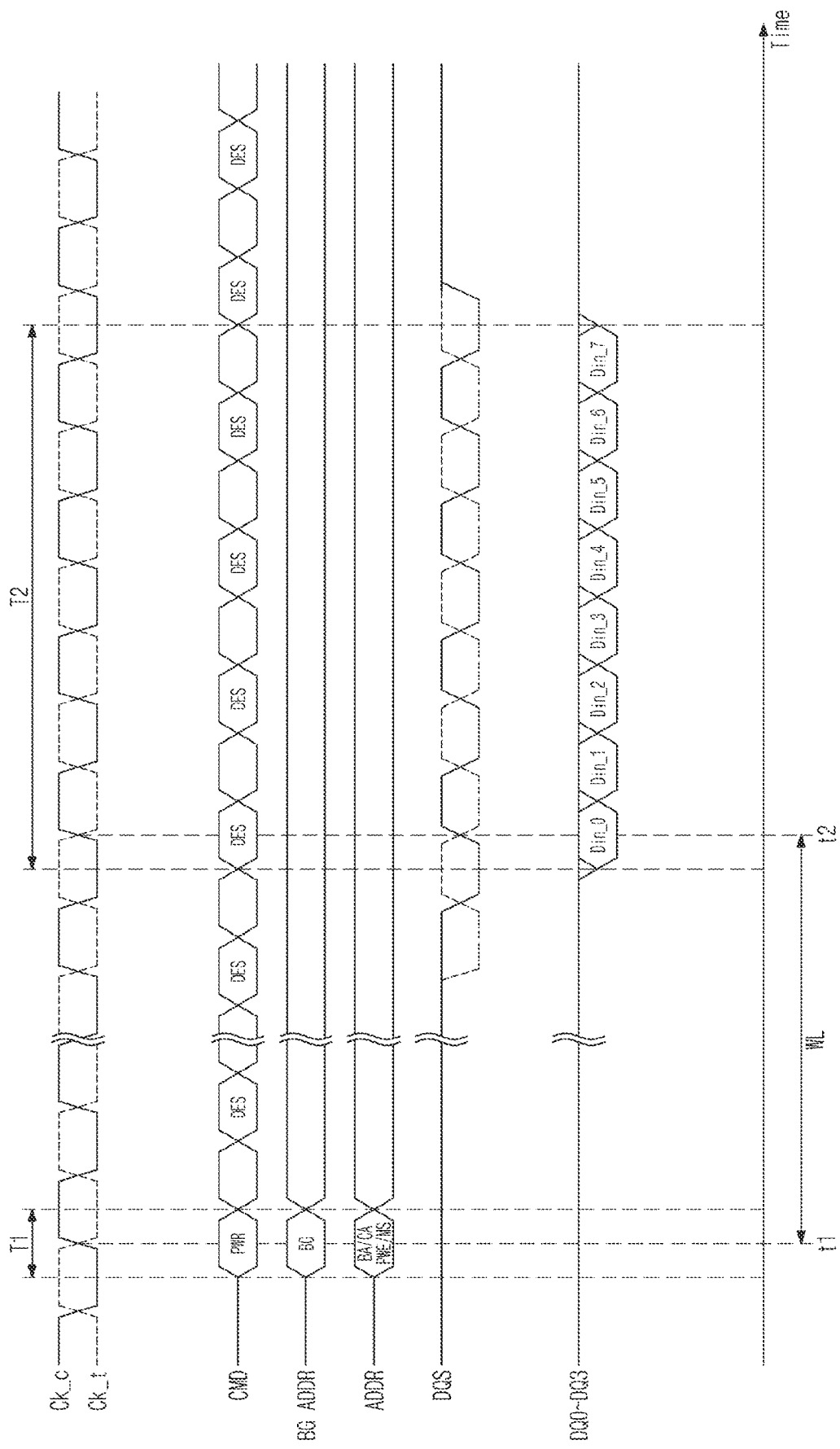
FIG. 6 is a timing diagram for describing a partial write operation of a memory system of FIG. 1.

FIG. 6 is a timing diagram for describing a partial write operation of a memory system of FIG. 1. In an embodiment, the memory system 10 may perform the partial write operation based on the timing diagram illustrated in FIG. 6. At a first time t1 (or at a first rising edge of the clock signal Ck_c), the host 11 may send a command and an address to the memory device 100. The host 11 may send the partial write command PWR through a command line (e.g., CMD). The host 11 may send the bank group address BG through a bank group address line (e.g., BG ADDR). The host 11 may send the bank address BA, the column address CA, the partial write enable signal PWE, and the plurality of mask signals MS through an address line (e.g., ADDR).

In an embodiment, after the write latency WL passes from the time t1 at which the partial write command PWR and the address are sent, input data may be sent through the data lines DQ (e.g., DQ0-DQ3) in synchronization with the data strobe signal DQS toggling.

In an embodiment, during the command/address input interval T1, the memory device 100 may receive the partial write command PWR and the address from the host 11. After the write latency WL passes from the time t1 at which the partial write command PWR and the address are sent, the memory device 100 may receive input data Din_0 to Din_7 from the host 11 during the data input interval T2.

The host 11 may send the partial write enable signal PWE and the plurality of mask signals MS0 to MS7 through the address line. Table 3 and Table 4 below show an example of a command truth table for the partial write command PWR, which is based on the protocol of the DDR 4.0 specification. In Table 4, "H" indicates a high level or logic high, and "L" indicates a low level or logic level. "V" indicates a specific level defined as one of "H" and "L".

TABLE 3

|  | CKE Previous Cycle | CKE Current Cycle | CS_n | ACT_n | RAS_n | CAS_n | WE_n | A12/PWE |
|---|---|---|---|---|---|---|---|---|
| PWR | H | H | L | H | H | L | L | H |

The host 11 may send the partial write enable signal PWE to the memory device 100 through the twelfth address line A12. The partial write command PWR may be sent by controlling the clock enable signal CKE, the chip select signal CS_n, the active signal ACT_n, the RAS signal RAS_n, the CAS signal CAS_n, the write enable signal WE_n, and the partial write enable signal PWE as shown in Table 3. For example, at the first time t1, the host 11 may send the partial write command PWR by setting the clock enable signal CKE to logic high "H" in a previous cycle and a current cycle, setting the chip select signal CS_n to logic low "L", setting the active signal ACT_n to logic high "H", setting the RAS signal RAS_n to logic high "H", setting the CAS signal CAS_n to logic low "L", setting the write enable signal WE_n to logic low "L", and setting the partial write enable signal PWE to logic high "H".

As described above, the write command WR and the partial write command PWR may be distinguished depending on the partial write enable signal PWE received through the twelfth address line A12. In the present disclosure, it is assumed that the case where the partial write enable signal PWE is set to logic high "H" indicates the partial write command PWR. However, the present disclosure is not limited thereto. For example, the case where the partial write enable signal PWE is set to logic low "L" may indicate the partial write command PWR depending on implementation.

TABLE 4

| BG0-BG1 | BA0-BA1 | C2 | C1 | C0 | A17 | A13 | A11 | A10 | A3-A9 | A2 | A1 | A0 |
|---|---|---|---|---|---|---|---|---|---|---|---|---|
| BG | BA | MS7 | MS6 | MS5 | V | MS4 | MS3 | V | CA | MS2 | MS1 | MS0 |

At the first time t1, the host 11 may send the bank group address BG to the memory device 100 through the 0-th and first bank group address lines BG0 and G1 and may send the bank address BA to the memory device 100 through the 0-th and first bank address lines BA0 and BA1. The host 11 may send the auto precharge signal AP through the tenth address line A10. The host 11 may send the column address CA through the third to ninth address lines A3 to A9. At the first time t1, the host 11 may set the tenth and seventeenth address lines A10 and A17 to a level corresponding to one of logic high "H" or logic low "L". The host 11 may send the 0-th mask signal MS0 to the memory device 100 through the 0-th address line A0, may send the first mask signal MS1 to the memory device 100 through the first address line A1, may send the second mask signal MS2 to the memory device 100 through the second address line A2, may send the third mask signal MS3 to the memory device 100 through the eleventh address line A11, may send the fourth mask signal MS4 to the memory device 100 through the thirteenth address line A13, may send the fifth mask signal MS5 to the memory device 100 through the 0-th chip identifier line C0, may send the sixth mask signal MS6 to the memory device 100 through the first chip identifier line C1, and may send the seventh mask signal MS7 to the memory device 100 through the second chip identifier line C2.

As described above, the memory system 10 according to an embodiment of the present disclosure may perform the partial write operation through reserved lines (e.g., the chip identifier lines C0 to C2 and the address lines A0 to A2, A11, A12, and A13). That is, the memory system 10 may send the partial write enable signal PWE and the plurality of mask signals MS0 to MS7 through the reserved lines.

In an embodiment, the plurality of mask signals MS may indicate a location of valid data of the input data Din. For example, each of the plurality of mask signals MS may be a signal indicating whether to mask or block the corresponding data of the input data Din. Each of the plurality of mask signals MS may be a signal indicating whether to store or write the corresponding data of the input data Din in the memory device 100. Each of the plurality of mask signals MS may be a signal indicating whether the corresponding data of the input data Din are valid data or dummy data.

When a mask signal is of a first logical value (e.g., logic low "L") indicating the disable state, the memory device 100 may store input data corresponding to the mask signal in memory cells. When a mask signal is of a second logical value (e.g., logic high "H") indicating the enable state, the memory device 100 may not store input data corresponding to the mask signal in memory cells. Alternatively, when a mask signal indicates the disable state, input data corresponding to the mask signal may be valid. When a mask signal indicates the enable state, input data corresponding to the mask signal may not be valid (i.e., input data corresponding to the mask signal may be dummy data).

During the command/address input interval T1, the host 11 may set the partial write enable signal PWE to logic high "H", may set the 0-th mask signal MS0 to logic low "L", and may set the first to seventh mask signals MS1 to MS7 to logic high "H". In this case, because the partial write enable signal PWE indicates the enable state and the 0-th mask signal MS0 indicates the disable state, the memory device 100 may store the input data Din_0 corresponding to the 0-th mask signal MS0 in a plurality of memory cells. Because the first to seventh mask signals MS1 to MS7 indicate the enable state, the memory device 100 may not store the input data Din_1 to Din_7 corresponding to the first to seventh mask signals MS1 to MS7 in a plurality of memory cells.

Figure 7A:
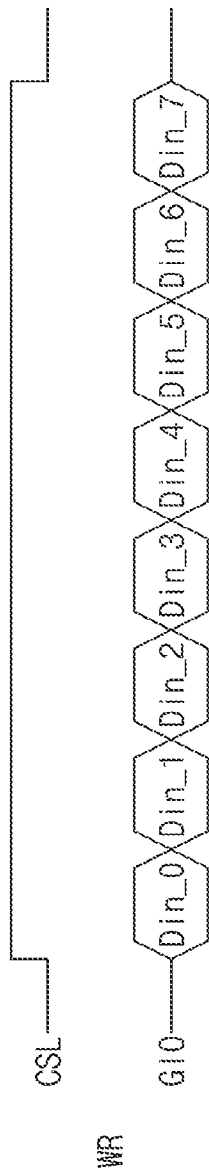
FIG. 7A is a timing diagram illustrating a write operation of a memory device of FIG. 1.
Figure 7B:
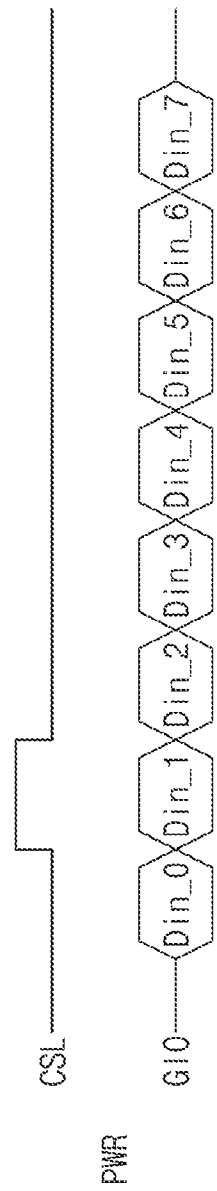
FIGS. 7B and 7C are timing diagrams illustrating a partial write operation of a memory device of FIG. 1.
Figure 7C:
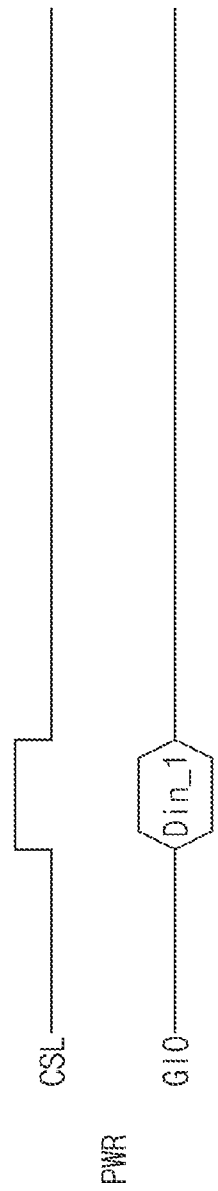

FIG. 7A is a timing diagram illustrating a write operation of a memory device of FIG. 1. FIGS. 7B and 7C are timing diagrams illustrating a partial write operation of a memory device of FIG. 1. It is assumed that the burst length BL is 8. Referring to FIGS. 3 and 7A to 7C, the memory device 100 may store the whole input data in the memory cell array 120 in response to the write command WR. The memory device 100 may store all or a part of input data in the memory cell array 120 in response to the partial write command PWR.

As illustrated in FIG. 7A, in the write operation (WR), the mask circuit 110 may allow all the input data Din_0 to Din_7 to be stored in the memory cell array 120. The mask circuit 110 may transfer the input data Din_0 to Din_7 to the write driver and sense amplifier 140 through the global input/output line GIO. The mask circuit 110 may control the column control signal C_CTRL such that there is enabled the column selection line CSL corresponding to a column address of each of the input data Din_0 to Din_7. Because there is enabled the column selection line CSL corresponding to the column address of each of the input data Din_0 to Din_7, the input data Din_0 to Din_7 all may be stored in the memory cell array 120.

The mask circuit 110 may control the column control signal C_CTRL based on the mask enable signal ME, the plurality of mask signals MS, and the data strobe signal DQS such that the partial write operation is performed. The mask circuit 110 may transfer all or a part of the input data Din to the write driver and sense amplifier 140 through the global input/output line GIO, based on the mask enable signal ME, the plurality of mask signals MS, and the data strobe signal DQS.

In the partial write operation (PWR), it is assumed that, during the command/address input interval T1, the partial write enable signal PWE is at logic high "H", the 0-th mask signal MS0 is at logic high "H", and the first to seventh mask signals MS1 to MS7 are at logic low "L".

Like FIG. 7A, as illustrated in FIG. 7B, the mask circuit 110 may transfer all of the input data Din_0 to Din_7 to the write driver and sense amplifier 140 through the global input/output line GIO. However, the mask circuit 110 may control the column control signal C_CTRL such that the column selection line CSL corresponding to a column address of the 0-th input data Din_0 is disabled, the column selection line CSL corresponding to a column address of the first input data Din_1 is enabled, the column selection line CSL corresponding to a column address of the second input data Din_2 is disabled, the column selection line CSL corresponding to a column address of the third input data Din_3 is disabled, the column selection line CSL corresponding to a column address of the fourth input data Din_4 is disabled, the column selection line CSL corresponding to a column address of the fifth input data Din_5 is disabled, the column selection line CSL corresponding to a column address of the sixth input data Din_6 is disabled, and the column selection line CSL corresponding to a column address of the seventh input data Din_7 is disabled.

Because only the column selection line CSL corresponding to the column address of the first input data Din_1 is enabled, the first input data Din_1 may be stored in the memory cell array 120, and the 0-th and second to seventh input data Din_0 and Din_2 to Din_7 may not be stored in the memory cell array 120.

As illustrated in FIG. 7C, the mask circuit 110 may transfer only the first input data Din_1 to the write driver and sense amplifier 140 through the global input/output line GIO. The mask circuit 110 may not transfer the 0-th and second to seventh input data Din_0 and Din_2 to Din_7 having a dummy value to the write driver and sense amplifier 140 through a global input/output line GIO.

The mask circuit 110 may control the column control signal C_CTRL such that the column selection line CSL corresponding to a column address of the 0-th input data Din_0 is disabled, the column selection line CSL corresponding to a column address of the first input data Din_1 is enabled, the column selection line CSL corresponding to a column address of the second input data Din_2 is disabled, the column selection line CSL corresponding to a column address of the third input data Din_3 is disabled, the column selection line CSL corresponding to a column address of the fourth input data Din_4 is disabled, the column selection line CSL corresponding to a column address of the fifth input data Din_5 is disabled, the column selection line CSL corresponding to a column address of the sixth input data Din_6 is disabled, and the column selection line CSL corresponding to a column address of the seventh input data Din_7 is disabled.

Because only the column selection line CSL corresponding to the column address of the first input data Din_1 is enabled, the first input data Din_1 may be stored in the memory cell array 120, and the 0-th and second to seventh input data Din_0 and Din_2 to Din_7 may not be stored in the memory cell array 120.

As described above, in the partial write operation, the memory device 100 may control the column selection line CSL such that a part of the input data Din is not stored in the memory cell array 120. Accordingly, the memory device 100 may reduce power consumption necessary to store the 0-th and second to seventh input data Din_0 and Din_2 to Din_7 in the memory cell array 120.

Figure 8:
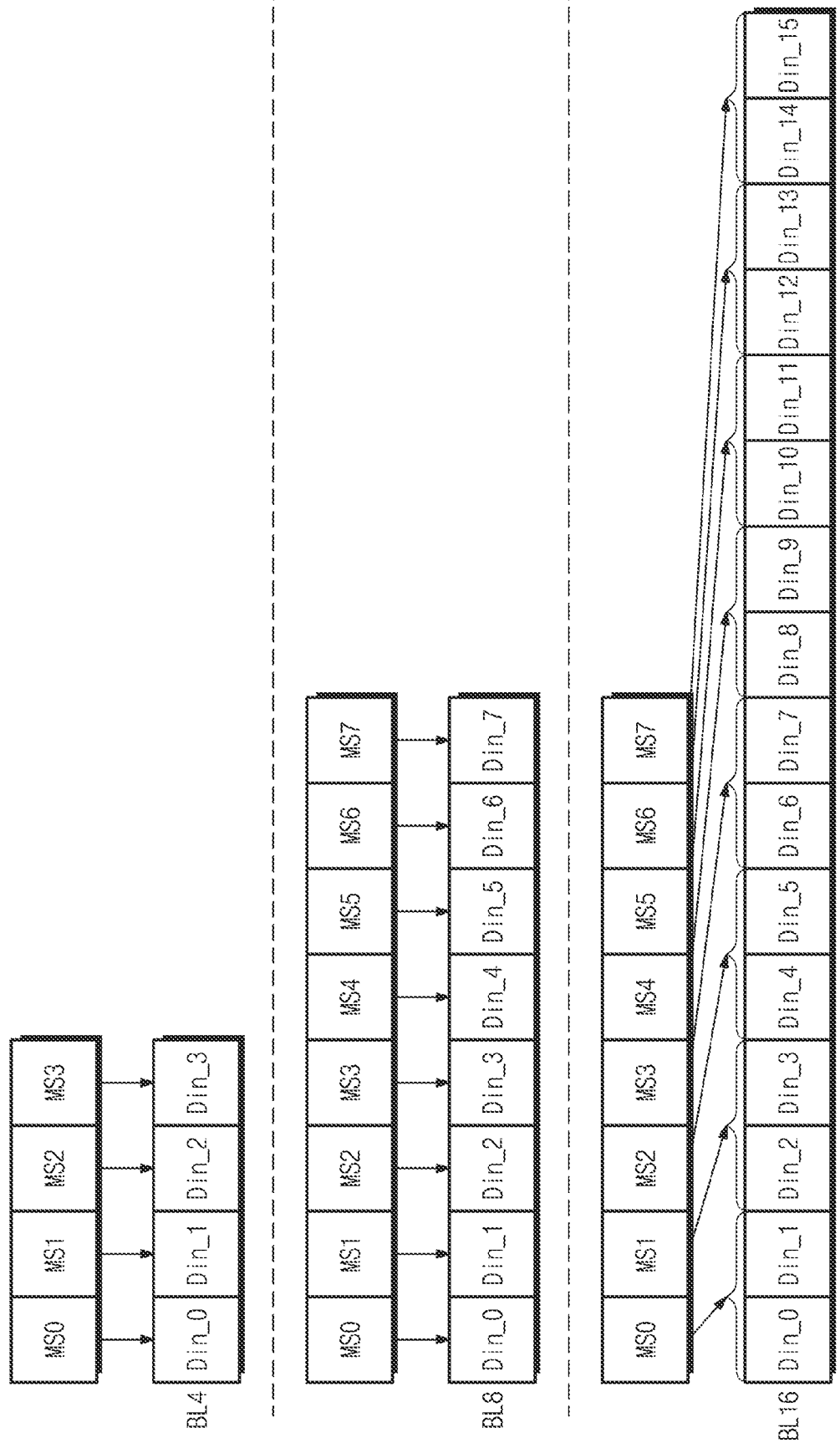
FIG. 8 is a diagram for describing a partial write operation of a memory system of FIG. 1.

FIG. 8 is a diagram for describing a partial write operation of a memory system of FIG. 1. A relationship between the burst length BL and the plurality of mask signals MS will be described with reference to FIG. 8. The number of input data respectively corresponding to the plurality of mask signals MS may be changed depending on the burst length BL.

In an embodiment, the number of mask signals MS may be changed depending on the burst length BL. For example, when the burst length BL is 4, the plurality of mask signals MS may include 0-th to third mask signals MS0 to MS3. When the burst length BL is 8 or 16, the plurality of mask signals MS may include 0-th to seventh mask signals MS0 to MS7.

In an embodiment, a size of input data corresponding to a mask signal may be changed depending on the burst length BL. For example, when the burst length BL is 4 or 8, a size of input data corresponding to a mask signal may correspond to a size of data input during one burst length. When the burst length BL is 16, a size of input data corresponding to a mask signal may correspond to a size of data input during 2 burst lengths.

When a burst length is 4 (BL4), the input data Din may include 0-th to third input data Din_0 to Din_3. The input data Din may include the 0-th input data Din_0 transferred to the plurality of data lines DQ during a 0-th burst length, the first input data Din_1 transferred to the plurality of data lines DQ during a first burst length, the second input data Din_2 transferred to the plurality of data lines DQ during a second burst length, and the third input data Din_3 transferred to the plurality of data lines DQ during a third burst length.

The 0-th mask signal MS0 may correspond to the 0-th input data Din_0, the first mask signal MS1 may correspond to the first input data Din_1, the second mask signal MS2 may correspond to the second input data Din_2, and the third mask signal MS3 may correspond to the third input data Din_3.

When a burst length is 8 (BL8), the input data Din may include 0-th to seventh input data Din_0 to Din_7. The input data Din may include the 0-th input data Din_0 transferred to the plurality of data lines DQ during a 0-th burst length, the first input data Din_1 transferred to the plurality of data lines DQ during a first burst length, the second input data Din_2 transferred to the plurality of data lines DQ during a second burst length, the third input data Din_3 transferred to the plurality of data lines DQ during a third burst length, the fourth input data Din_4 transferred to the plurality of data lines DQ during a fourth burst length, the fifth input data Din_5 transferred to the plurality of data lines DQ during a fifth burst length, the sixth input data Din_6 transferred to the plurality of data lines DQ during a sixth burst length, and the seventh input data Din_7 transferred to the plurality of data lines DQ during a seventh burst length.

The 0-th mask signal MS0 may correspond to the 0-th input data Din_0, the first mask signal MS1 may correspond to the first input data Din_1, the second mask signal MS2 may correspond to the second input data Din_2, the third mask signal MS3 may correspond to the third input data Din_3, the fourth mask signal MS4 may correspond to the fourth input data Din_4, the fifth mask signal MS5 may correspond to the fifth input data Din_5, the sixth mask signal MS6 may correspond to the sixth input data Din_6, and the seventh mask signal MS7 may correspond to the seventh input data Din_7.

When a burst length is 16 (BL16), the input data Din may include 0-th to fifteenth data Din_0 to Din_15. The input data Din may include the 0-th input data Din_0 transferred to the plurality of data lines DQ during a 0-th burst length, the first input data Din_1 transferred to the plurality of data lines DQ during a first burst length, the second input data Din_2 transferred to the plurality of data lines DQ during a second burst length, and the third input data Din_3 transferred to the plurality of data lines DQ during a third burst length. The remaining input data Din_4 to Din_15 have a structure similar to that described above, and thus, additional description will be omitted to avoid redundancy.

The 0-th mask signal MS0 may correspond to the 0-th and first input data Din_0 and Din_1, the first mask signal MS1 may correspond to the second and third input data Din_2 and Din_3, the second mask signal MS2 may correspond to the fourth and fifth input data Din_4 and Din_5, the third mask signal MS3 may correspond to the sixth and seventh input data Din_6 and Din_7, the fourth mask signal MS4 may correspond to the eighth and ninth input data Din_8 and Din_9, the fifth mask signal MS5 may correspond to the tenth and eleventh input data Din_10 and Din_11, the sixth mask signal MS6 may correspond to the twelfth and thirteenth input data Din_12 and Din_13, and the seventh mask signal MS7 may correspond to the fourteenth and fifteenth input data Din_14 and Din_15.

As described above, a configuration of mask signals and the number of input data corresponding to the configuration of mask signals may be changed depending on a burst length. In the present disclosure, an example of burst lengths of 4, 8, and 16 is described, but the present disclosure is not limited thereto. For example, a burst length may increase or decrease, and the number of input data respectively corresponding to mask signals may be changed depending on a burst length.

Figure 9:
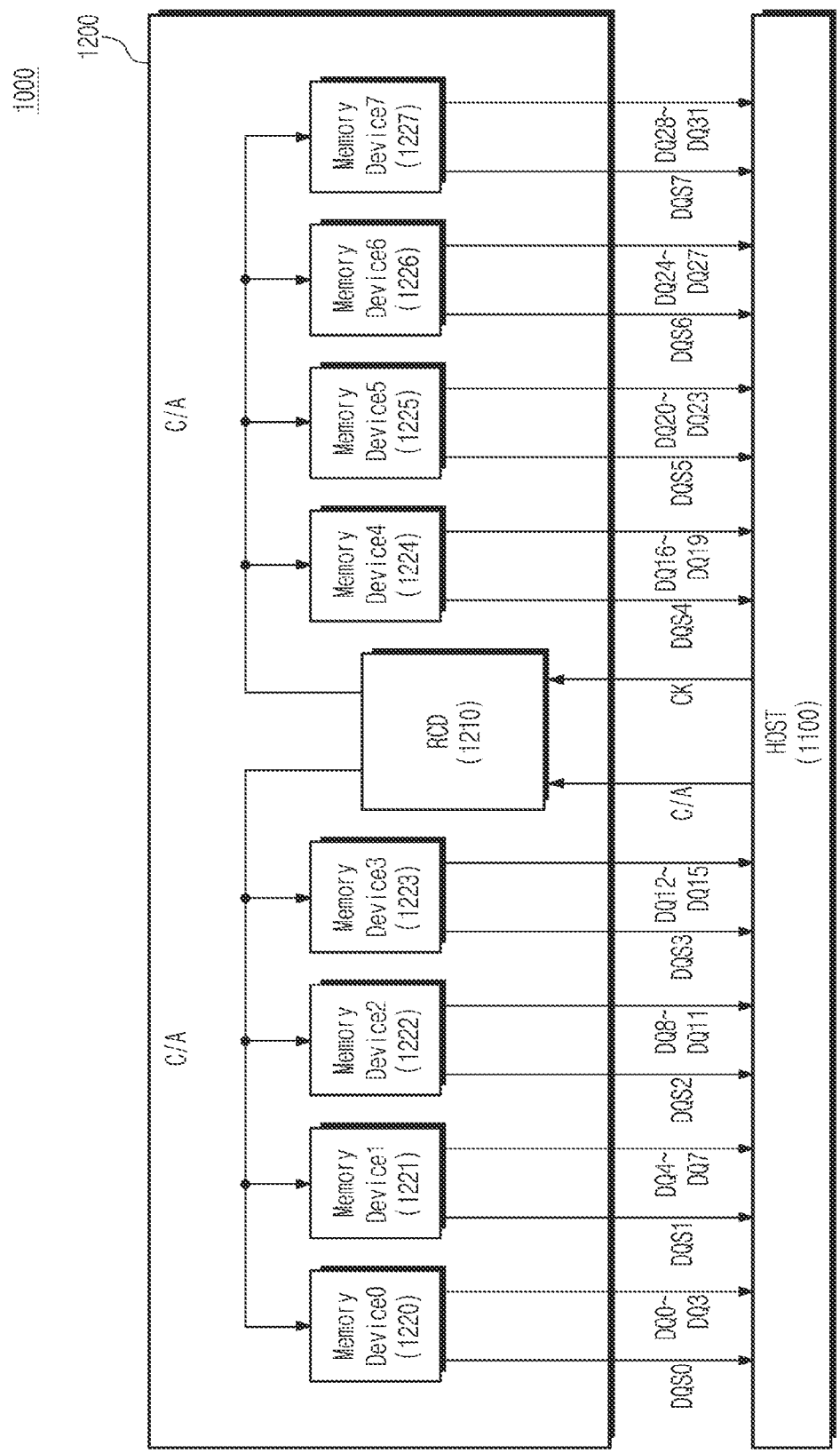
FIG. 9 is a block diagram illustrating a memory system, according to an embodiment of the present disclosure.

FIG. 9 is a block diagram illustrating a memory system, according to an embodiment of the present disclosure. Referring to FIG. 9, a memory system 1000 may include a host 1100 and a memory module 1200. The memory module 1200 may include a register clock driver (RCD) 1210 and 0-th seventh memory devices 1220 to 1227. For convenience of description, additional description associated with the components described above will be omitted to avoid redundancy.

The RCD 1210 may receive the command/address signal C/A and the clock signal CK from an external device (e.g., a host or a memory controller). The RCD 1210 may provide the command/address signal C/A to the plurality of memory devices 1220 to 1227, based on the received signals.

Each of the plurality of memory devices 1220 to 1227 may send/receive the corresponding data strobe signal DQS. For example, the 0-th memory device 1220 may exchange a 0-th data strobe signal DQS0 with the host 1100 through a 0-th data strobe line. The first memory device 1221 may exchange a first data strobe signal DQS1 with the host 1100 through a first data strobe line. The second memory device 1222 may exchange a second data strobe signal DQS2 with the host 1100 through a second data strobe line. The third memory device 1223 may exchange a third data strobe signal DQS3 with the host 1100 through a third data strobe line. The fourth memory device 1224 may exchange a fourth data strobe signal DQS4 with the host 1100 through a fourth data strobe line. The fifth memory device 1225 may exchange a fifth data strobe signal DQS5 with the host 1100 through a fifth data strobe line. The sixth memory device 1226 may exchange a sixth data strobe signal DQS6 with the host 1100 through a sixth data strobe line. The seventh memory device 1227 may exchange a seventh data strobe signal DQS7 with the host 1100 through a seventh data strobe line.

Each of the plurality of memory devices 1220 to 1227 may exchange data with the host 1100 through corresponding data lines. It is assumed that each of the plurality of memory devices 1220 to 1227 is connected with the host 1100 through 4 data lines. However, the present disclosure is not limited thereto. For example, the number of data lines connected with each of the plurality of memory devices 1220 to 1227 decreases or is changed depending on the way to implement.

For example, the 0-th memory device 1220 may exchange data with the host 1100 through 0-th to third data lines DQ0 to DQ3. The first memory device 1221 may exchange data with the host 1100 through fourth to seventh data lines DQ4 to DQ7. The second memory device 1222 may exchange data with the host 1100 through eighth to eleventh data lines DQ8 to DQ11. The third memory device 1223 may exchange data with the host 1100 through twelfth to fifteenth data lines DQ12 to DQ15. The fourth memory device 1224 may exchange data with the host 1100 through sixteenth to nineteenth data lines DQ16 to DQ19. The fifth memory device 1225 may exchange data with the host 1100 through twentieth to twenty-third data lines DQ20 to DQ23. The sixth memory device 1226 may exchange data with the host 1100 through twenty-fourth to twenty-seventh data lines DQ24 to DQ27. The seventh memory device 1227 may exchange data with the host 1100 through twenty-eighth to thirty-first data lines DQ28 to DQ31.

In an embodiment, each of the plurality of memory devices 1220 to 1227 may include the mask circuit 110 described with reference to FIGS. 1 to 8. That is, each of the plurality of memory devices 1220 to 1227 may perform the partial write operation.

In an embodiment, the memory module 1200 illustrated in FIG. 9 may be a registered DIMM (RDIMM). However, the present disclosure is not limited thereto. For example, the memory module 1200 may be the form factor of a load reduced dual in-line memory module (LR-DIMM) that further includes a plurality of data buffers respectively connected with the plurality of memory devices 1220 to 1227 through memory data lines. The plurality of data buffers may exchange data with an external device (e.g., a host or a memory controller) through the plurality of data lines DQ.

For example, the plurality of memory devices 1220 to 1227 may be respectively connected with the plurality of data buffers through memory data lines. Each of the plurality of data buffers may be connected with the corresponding data lines and may exchange data with the external device through the data lines. Each of the plurality of data buffers may transfer received data to the corresponding memory device through each of memory data lines.

For example, the 0-th memory device 1220 may be connected with a 0-th data buffer, the first memory device 1221 may be connected with a first data buffer, the second memory device 1222 may be connected with a second data buffer, the third memory device 1223 may be connected with a third data buffer, the fourth memory device 1224 may be connected with a fourth data buffer, the fifth memory device 1225 may be connected with a fifth data buffer, the sixth memory device 1226 may be connected with a sixth data buffer, and the seventh memory device 1227 may be connected with a seventh data buffer.

Figure 10:
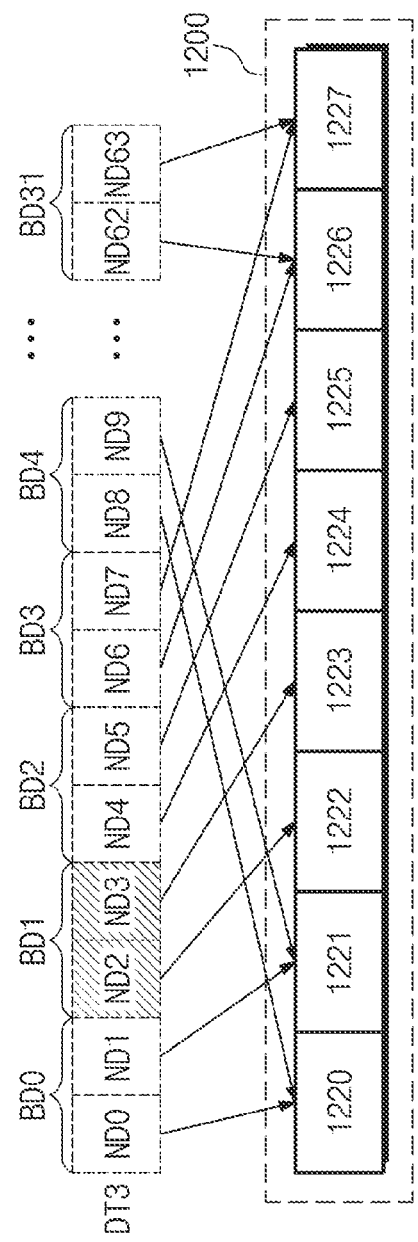
FIG. 10 is a diagram for describing a partial write operation of a memory system of FIG. 9.

FIG. 10 is a diagram for describing a partial write operation of a memory system of FIG. 9. It is assumed that the burst length BL is 8 and each of the plurality of memory devices 1220 to 1227 is connected with the host 1100 through 4 data lines DQ. However, the present disclosure is not limited thereto. For example, the burst length BL and the number of data lines DQ connected with each of a plurality of memory devices may be changed.

Referring to FIGS. 9 and 10, the number of memory devices 1220 to 1227 included in the memory module 1200 is 8, the burst length BL is 8, the number of data lines DQ connected with each of the plurality of memory devices 1220 to 1227 is 4, the memory module 1200 may store data corresponding to 32 bytes (e.g., 32B) through one write operation. Because the memory module 1200 is capable of performing the partial write operation, the memory module 1200 may store data in a nibble unit or a byte unit. For example, as illustrated in FIG. 2B, the host 1100 may store the third data DT3 in the memory module 1200.

As illustrated in FIG. 10, the 0-th byte data BD0 may include 0-th nibble data ND0 and first nibble data ND1, the first byte data BD1 may include second nibble data ND2 and third nibble data ND3, and the second byte data BD2 may include fourth nibble data ND4 and fifth nibble data ND5. The third byte data BD3 may include sixth nibble data ND6 and seventh nibble data ND7. The remaining byte data BD4 to BD31 have a structure similar to that described above, and thus, additional description will be omitted to avoid redundancy.

In an embodiment, the memory module 1200 may receive the 0-th input data Din_0 at a 0-th burst length BL0, may receive the first input data Din_1 at a first burst length BL1, may receive the second input data Din_2 at a second burst length BL2, may receive the third input data Din_3 at a third burst length BL, may receive the fourth input data Din_4 at a fourth burst length BL4, may receive the fifth input data Din_5 at a fifth burst length BL5, may receive the sixth input data Din_6 at a sixth burst length BL6, and may receive the seventh input data Din_7 at a seventh burst length BL7.

As described above, the memory devices 1220 to 1227 included in the memory module 1200 may receive the same command/address signal C/A and the same clock signal CK. In contrast, each of the memory devices 1220 to 1227 included in the memory module 1200 may receive different data strobe signals DQS and different data.

The 0-th input data Din_0 may include the 0-th to third byte data BD0 to BD3, the first input data Din_1 may include the fourth to seventh byte data BD4 to BD7, the second input data Din_2 may include the eighth to eleventh byte data BD8 to BD11, the third input data Din_3 may include the twelfth to fifteenth byte data BD12 to BD15, the fourth input data Din_4 may include the sixteenth to nineteenth byte data BD16 to BD19, the fifth input data Din_5 may include the twentieth to twenty-third byte data BD20 to BD23, the sixth input data Din_6 may include the twenty-fourth to twenty-seventh byte data BD24 to BD27, and the seventh input data Din_7 may include the twenty-eighth to thirty-first byte data BD28 to BD31.

In other words, the 0-th input data Din_0 may include the 0-th to 7th nibble data ND0 to ND7, the first input data Din_1 may include the 8th to 15th nibble data ND8 to ND15, the second input data Din_2 may include the 16th to 23rd nibble data ND16 to ND23, the third input data Din_3 may include the 24th to 31st nibble data ND24 to ND31, the fourth input data Din_4 may include the 32nd to 39th nibble data ND32 to ND39, the fifth input data Din_5 may include the 40th to 47th nibble data ND40 to ND47, the sixth input data Din_6 may include the 48th to 55th nibble data ND48 to ND55, and the seventh input data Din_7 may include the 56th to 63rd nibble data ND56 to ND63.

Each of pieces of nibble data included in the input data Din may be input to the corresponding memory device of the memory devices 1220 to 1227. At the 0-th burst length BL0, the 0-th nibble data ND0 may be input to the 0-th memory device 1220 through a plurality of data lines DQ0 to DQ3, the first nibble data ND1 may be input to the first memory device 1221 through a plurality of data lines DQ4 to DQ7, the second nibble data ND2 may be input to the second memory device 1222 through a plurality of data lines DQ8 to DQ11, the third nibble data ND3 may be input to the third memory device 1223 through a plurality of data lines DQ12 to DQ15, the fourth nibble data ND4 may be input to the fourth memory device 1224 through a plurality of data lines DQ16 to DQ19, the fifth nibble data ND5 may be input to the fifth memory device 1225 through a plurality of data lines DQ20 to DQ23, the sixth nibble data ND6 may be input to the sixth memory device 1226 through a plurality of data lines DQ24 to DQ28, and the seventh nibble data ND7 may be input to the seventh memory device 1227 through a plurality of data lines DQ29 to DQ31.

At the first burst length BL1, the eighth nibble data ND8 may be input to the 0-th memory device 1220 through the plurality of data lines DQ0 to DQ3, the ninth nibble data ND9 may be input to the first memory device 1221 through the plurality of data lines DQ4 to DQ7, the tenth nibble data ND10 may be input to the second memory device 1222 through the plurality of data lines DQ8 to DQ11, the eleventh nibble data ND11 may be input to the third memory device 1223 through the plurality of data lines DQ12 to DQ15, the twelfth nibble data ND12 may be input to the fourth memory device 1224 through the plurality of data lines DQ16 to DQ19, the thirteenth nibble data ND13 may be input to the fifth memory device 1225 through the plurality of data lines DQ20 to DQ23, the fourteenth nibble data ND14 may be input to the sixth memory device 1226 through the plurality of data lines DQ24 to DQ28, and the fifteenth nibble data ND15 may be input to the seventh memory device 1227 through the plurality of data lines DQ29 to DQ31. As in the above description, the remaining nibble data ND16 to ND63 are stored in the memory devices 1220 to 1227, and thus, additional description will be omitted to avoid redundancy.

That is, the 0-th memory device 1220 may receive the nibble data ND0, ND8, ND16, ND24, ND32, ND40, ND48, and ND56, the first memory device 1221 may receive the nibble data ND1, ND9, ND17, ND25, ND33, ND41, ND49, and ND57, the second memory device 1222 may receive the nibble data ND2, ND10, ND18, ND26, ND34, ND42, ND50, and ND58, the third memory device 1223 may receive the nibble data ND3, ND11, ND19, ND27, ND35, ND43, ND51, and ND59, the fourth memory device 1224 may receive the nibble data ND4, ND12, ND20, ND28, ND36, ND44, ND52, and ND60, the fifth memory device 1225 may receive the nibble data ND5, ND13, ND21, ND29, ND37, ND45, ND53, and ND61, the sixth memory device 1226 may receive the nibble data ND6, ND14, ND22, ND30, ND38, ND46, ND54, and ND62, and the seventh memory device 1227 may receive the nibble data ND7, ND15, ND23, ND31, ND39, ND47, ND55, and ND63.

Because the second and third nibble data ND2 and ND3 are valid and the remaining nibble data ND0, ND1, and ND4 to ND63 are dummy data, the second memory device 1222 receiving the second nibble data ND2 and the third memory device 1223 receiving the third nibble data ND3 may be target devices, and the remaining memory devices 1220, 1221, 1224, 1225, 1226, and 1227 may be non-target memory devices.

For example, a target memory device may indicate a memory device that receives all or a part of input data as valid data, and a non-target memory device may be a memory device that receives only dummy data. Alternatively, a target memory device may indicate a memory device that receives the data strobe signal DQS toggling, and a non-target memory device may be a memory device that receives the data strobe signal DQS maintaining logic high "H".

In an embodiment, under control of the host 1100, the data strobe signal DQS that is output to a target memory device may toggle, and the data strobe signal DQS that is output to a non-target memory device may not toggle. The host 1100 may set the data strobe signal DQS, which is output to a non-target memory device, to logic high "H".

As described above, the memory system 1000 according to an embodiment of the present disclosure may perform the partial write operation. The memory device 100 may determine whether input data are valid, through the plurality of mask signals MS0 to MS7 and/or the data strobe signal DQS.

Figure 11A:
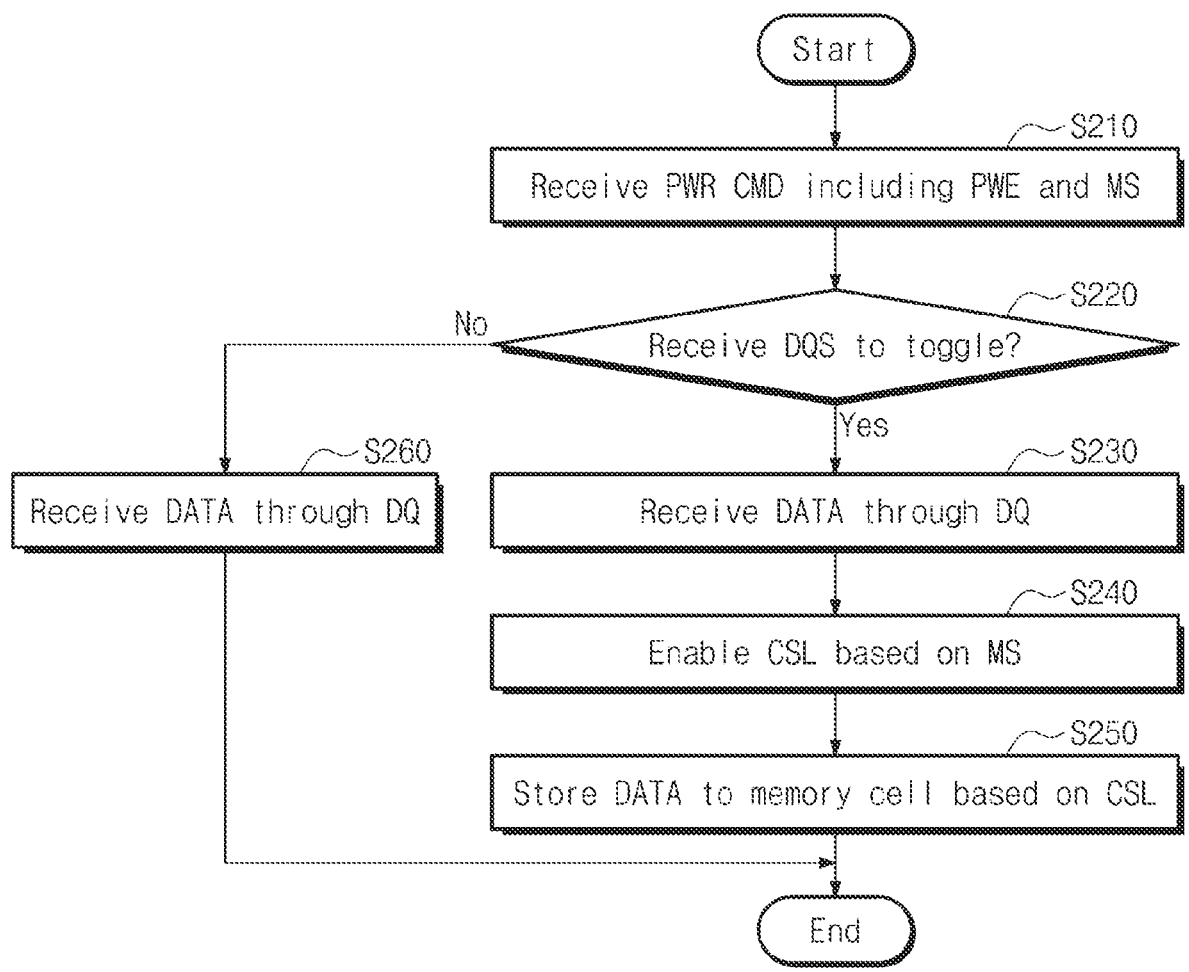
FIG. 11A is a flowchart for describing a partial write operation of each of memory devices of FIG. 9.

FIG. 11A is a flowchart for describing a partial write operation of each of memory devices of FIG. 9. Referring to FIGS. 9 and 11A, in operation S210, each of the memory devices 1220 to 1227 may receive a partial write command including the partial write enable signal PWE and the plurality of mask signals MS. Operation S210 is similar to operation S110 of FIG. 5, and thus, additional description will be omitted to avoid redundancy.

In operation S220, each of the memory devices 1220 to 1227 may determine whether the data strobe signal DQS toggling is received. When it is determined that each of the memory devices 1220 to 1227 receives the data strobe signal DQS toggling, operation S230 may be performed; when it is determined that each of the memory devices 1220 to 1227 does not receive the data strobe signal DQS toggling, operation S260 may be performed. That is, a target memory device that receives the data strobe signal DQS toggling may perform operation S230, and a non-target memory device that does not receive the data strobe signal DQS toggling may perform operation S260.

In operation S230, each of the target memory devices may receive the input data Din through the plurality of data lines DQ. In operation S240, each of the target memory devices may enable a column selection line based on the plurality of mask signals MS. Operation S240 is similar to operation S130 of FIG. 5, and thus, additional description will be omitted to avoid redundancy.

In operation S250, each of the target memory devices may store data in a plurality of memory cells based on the column selection line CSL. Operation S250 is similar to operation S140 of FIG. 5, and thus, additional description will be omitted to avoid redundancy.

In operation S260, each of the non-target memory devices may receive the input data Din through the plurality of data lines DQ. For example, each of the non-target memory devices may receive dummy data through the plurality of data lines DQ. Each of the non-target memory devices may not perform operation S250 and operation S260.

In an embodiment, because each of the non-target memory devices receives only dummy data, each of the non-target memory devices may disable a column selection line. Alternatively, each of the non-target memory devices may maintain a disable state of a column selection line. Each of the non-target memory devices may not store the received input data (i.e., the dummy data) in a plurality of memory cells.

Figure 11B:
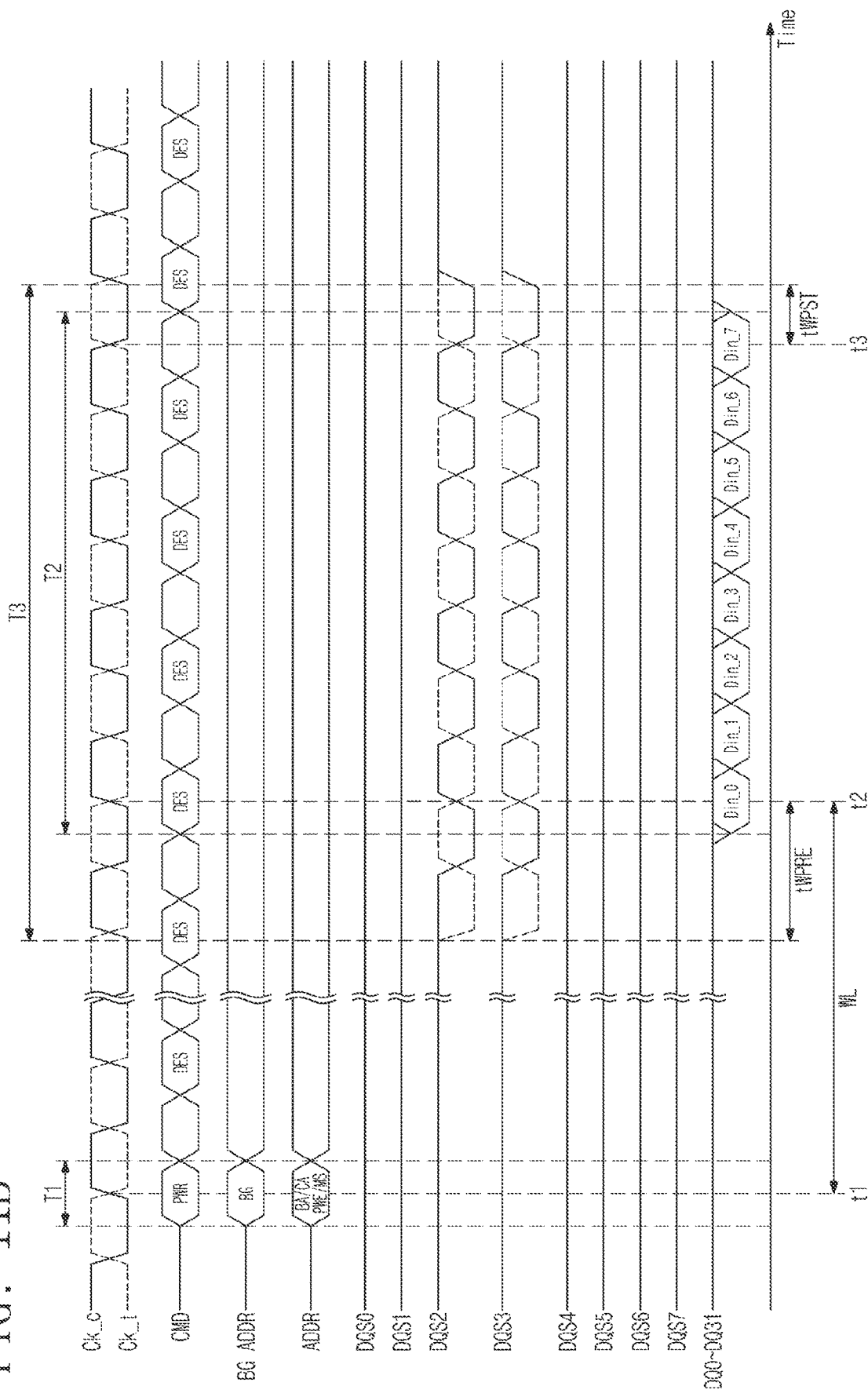
FIG. 11B is a timing diagram for describing a partial write operation of a memory system of FIG. 9.

FIG. 11B is a timing diagram for describing a partial write operation of a memory system of FIG. 9. Only the first byte data BD1 may have a valid data value, and the remaining byte data BD0 and BD2 to BD31 may have a dummy data value. That is, the host 1100 may perform the partial write operation on the first byte data BD1. For convenience of description, additional description associated with the components described above will be omitted to avoid redundancy.

The memory system 1000 may perform the partial write operation based on the timing diagram illustrated in FIG. 11B. At a first time t1, the host 1100 may send a command and an address to the memory module 1200. The host 1100 may send the partial write command PWR through a command line (e.g., CMD). The host 1100 may send the bank group address BG through a bank group address line (e.g., BG ADDR). The host 1100 may send the bank address BA, the column address CA, the partial write enable signal PWE, and the plurality of mask signals MS through an address line (e.g., ADDR).

In an embodiment, after the write latency WL passes from the time t1 at which the partial write command PWR and the address are sent, the input data Din may be sent through the data lines DQ0 to DQ31.

In an embodiment, during the command/address input interval T1, the memory module 1200 may receive the partial write command PWR and the address from the host 1100. After the write latency WL passes from the time t1 at which the partial write command PWR and the address are sent, the memory module 1200 may receive input data from the host 1100 during the data input interval T2. A command truth table for the partial write command PWR is described above, and thus, additional description will be omitted to avoid redundancy.

In an embodiment, the first byte data BD1 of the input data may have a valid value and the remaining byte data BD0 and BD2 to BD31 thereof may have a dummy value. A part of the 0-th input data Din_0 may have a valid value. All of the first to seventh data Din_1 to Din_7 may have a dummy value. The second and third nibble data ND2 and ND3 of the 0-th input data Din_0 may have a valid value. The 0-th, first, fourth, fifth, sixth, and seventh nibble data ND0, ND1, ND4, ND5, ND6, and ND7 of the 0-th input data Din_0 may have a dummy value.

Because the first byte data BD1 are included in the 0-th input data Din_0, at the first time t1, the host 1100 may set the partial write enable signal PWE to logic high "H", may set the 0-th mask signal MS0 to logic low "L", and may set the first to seventh mask signals MS1 to MS7 to logic high "H".

At the 0-th burst length BL0, the memory module 1200 may receive input data (e.g., the 0-th input data Din_0) including a valid value. At the first to seventh burst length BL1 to BL7, the memory module 1200 may receive input data (e.g., the first to seventh input data Din_1 to Din_7) including a dummy value.

Because the 0-th mask signal MS0 is at logic low "L" indicating the disable state, the memory module 1200 may store all or a part of the input data (e.g., the 0-th input data Din_0) corresponding to the 0-th mask signal in memory cells. Because the first to seventh mask signals MS1 to MS7 are at logic high "H" indicating the enable state, the memory module 1200 may not store the input data (e.g., the first to seventh input data Din_1 to Din_7) corresponding to the first to seventh mask signals MS1 to MS7 in memory cells.

Even though the 0-th mask signal MS0 is at logic low "L", valid data may not be input to the plurality of memory devices 1220 to 1227. That is, even though a mask signal indicates a disable state, a part of input data corresponding to the mask signal may have a dummy value. That is, the 0-th input data Din_0 may include dummy data. As such, whether data (i.e., burst data) (e.g., the 0-th input data Din_0) input to the memory module 1200 during one burst length are valid may be determined through the data strobe signal DQS.

Because the second and third nibble data ND2 and ND3 of the 0-th input data Din_0 have a valid value and the remaining nibble data ND0, ND1, ND4, ND5, ND6, and ND7 of the 0-th input data Din_0 have a dummy value, the second and third memory devices 1222 and 1223 may receive valid data, and the remaining memory devices 1220, 1221, 1224, 1225, 1226, and 1227 may receive dummy data.

In an embodiment, the second and third data strobe signals DQS2 and DQS3 may toggle under control of the host 1100. Under control of the host 1100, the second and third data strobe signals DQS2 and DQS3 may start to toggle before a write preamble latency tWPRE from the second time t2. Under control of the host 1100, the second and third data strobe signals DQS2 and DQS3 may toggle from a third time t3, at which the last input data (e.g., the seventh input data Din_7) are sent, to a time at which a write postamble latency tWPST passes. That is, the second and third data strobe signals DQS2 and DQS3 may toggle during a strobe toggle interval T3.

For example, the write preamble latency tWPRE may be set by setting a mode register. For example, the write preamble latency tWPRE may be set to 1 tck or 2 tck through the setting of the mode register. The write postamble latency tWPST may have a value determined in advance. For example, the write postamble latency tWPST may be 0.5 tck.

Under control of the host 1100, the 0-th, first, fourth, fifth, sixth, and seventh data strobe signals DQS0, DQS1, DQS4, DQS5, DQS6, and DQS7 may not toggle during the strobe toggle interval T3. That is, the host 1100 may set the 0-th, first, fourth, fifth, sixth, and seventh data strobe signals DQS0, DQS1, DQS4, DQS5, DQS6, and DQS7 to logic high "H" during the strobe toggle interval T3.

As described above, the host 1100 may allow the data strobe signal DQS, which is output to target memory devices (e.g., 1222 and 1223), to toggle and may output data through the plurality of data lines DQ. The host 1100 may set the data strobe signal DQS, which is output to non-target memory devices (e.g., 1220, 1221, 1224, 1225, 1226, and 1227), to logic high "H" during the strobe toggle interval T3 and may output dummy data through the plurality of data lines DQ.

Each of the plurality of memory devices 1220 to 1227 may perform the partial write operation through the partial write enable signal PWE, the plurality of mask signals MS, and the data strobe signal DQS. Because the partial write enable signal PWE is at logic high "H", each of the plurality of memory devices 1220 to 1227 may identify the partial write command PWR.

Because the first to seventh mask signals MS1 to MS7 are at logic high "H", each of the plurality of memory devices 1220 to 1227 may identify that the first to seventh input data Din_1 to Din_7 are dummy data. Each of the plurality of memory devices 1220 to 1227 may disable column selection lines corresponding to the first to seventh input data Din_1 to Din_7. Each of the plurality of memory devices 1220 to 1227 may not store the first to seventh input data Din_1 to Din_7 in memory cells.

Each of the plurality of memory devices 1220 to 1227 may determine whether the data strobe signal DQS toggling is received. During the strobe toggle interval T3, each of the plurality of memory devices 1220 to 1227 may determine whether the corresponding data strobe signal DQS toggles. When it is determined that the data strobe signal DQS toggles during the strobe toggle interval T3, each of the plurality of memory devices 1220 to 1227 may determine that all or a part of input data is valid data. When the data strobe signal DQS is at logic high "H" during the strobe toggle interval T3, each of the plurality of memory devices 1220 to 1227 may determine that the whole input data are dummy data.

For example, during the strobe toggle interval T3, the target memory devices 1222 and 1223 may determine that the data strobe signal DQS toggles. Because the second data strobe signal DQS2 toggles during the strobe toggle interval T3 and the 0-th mask signal MS0 is at the disable state, the second memory device 1222 may store the second nibble data ND2 at memory cells. Because the third data strobe signal DQS3 toggles during the strobe toggle interval T3 and the 0-th mask signal MS0 is at the disable state, the third memory device 1223 may store the third nibble data ND3 at memory cells.

During the strobe toggle interval T3, the non-target memory devices 1220, 1221, and 1224 to 1227 may determine that the data strobe signal DQS maintains logic high "H". Because the corresponding data strobe signals DQS0, DQS1, and DQS4 to DQS7 are at logic high "H" during the strobe toggle interval T3, the non-target memory devices 1220, 1221, and 1224 to 1227 may determine that the whole input data are dummy data. The non-target memory devices 1220, 1221, and 1224 to 1227 may not store input data received during the 0-th burst length BL0 in memory cells. The non-target memory devices 1220, 1221, and 1224 to 1227 may not store the whole input data in memory cells.

Figure 12A:
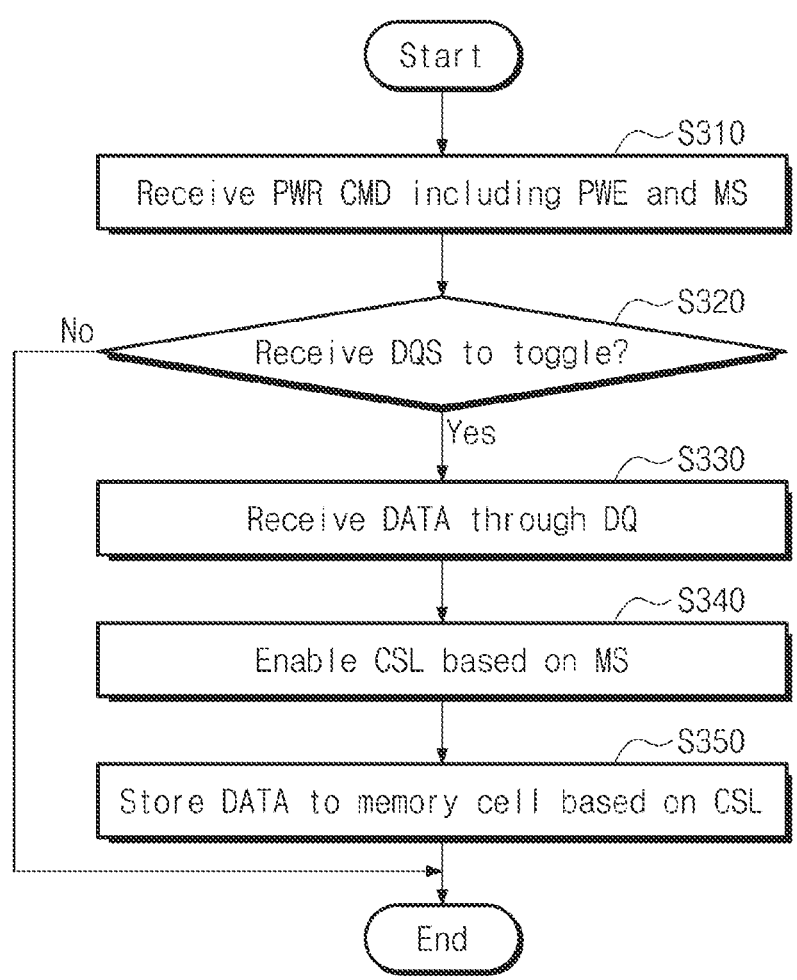
FIG. 12A is a flowchart for describing a partial write operation of each of memory devices of FIG. 9.

FIG. 12A is a flowchart for describing a partial write operation of each of memory devices of FIG. 9. Referring to FIGS. 9 and 12A, in operation S310, each of the memory devices 1220 to 1227 may receive the partial write command PWR including the partial write enable signal PWE and the plurality of mask signals MS. Operation S310 is similar to operation S210 of FIG. 11A, and thus, additional description will be omitted to avoid redundancy.

In operation S320, each of the memory devices 1220 to 1227 may determine whether the data strobe signal DQS toggling is received. When it is determined that each of the memory devices 1220 to 1227 receives the data strobe signal DQS toggling, operation S330 may be performed; when it is determined that each of the memory devices 1220 to 1227 does not receive the data strobe signal DQS toggling, operation S330 to operation S350 may not be performed. That is, a target memory device that receives the data strobe signal DQS toggling may perform operation S330, and a non-target memory device that receives the data strobe signal DQS maintained at logic high "H" may not perform operation S330 to operation S350.

Operation S330 to operation S350 are similar to operation S230 to operation S250 of FIG. 11A, and thus, additional description will be omitted to avoid redundancy. Compared to FIG. 11A, each of non-target memory devices may not receive the input data Din through the plurality of data lines DQ.

Figure 12B:
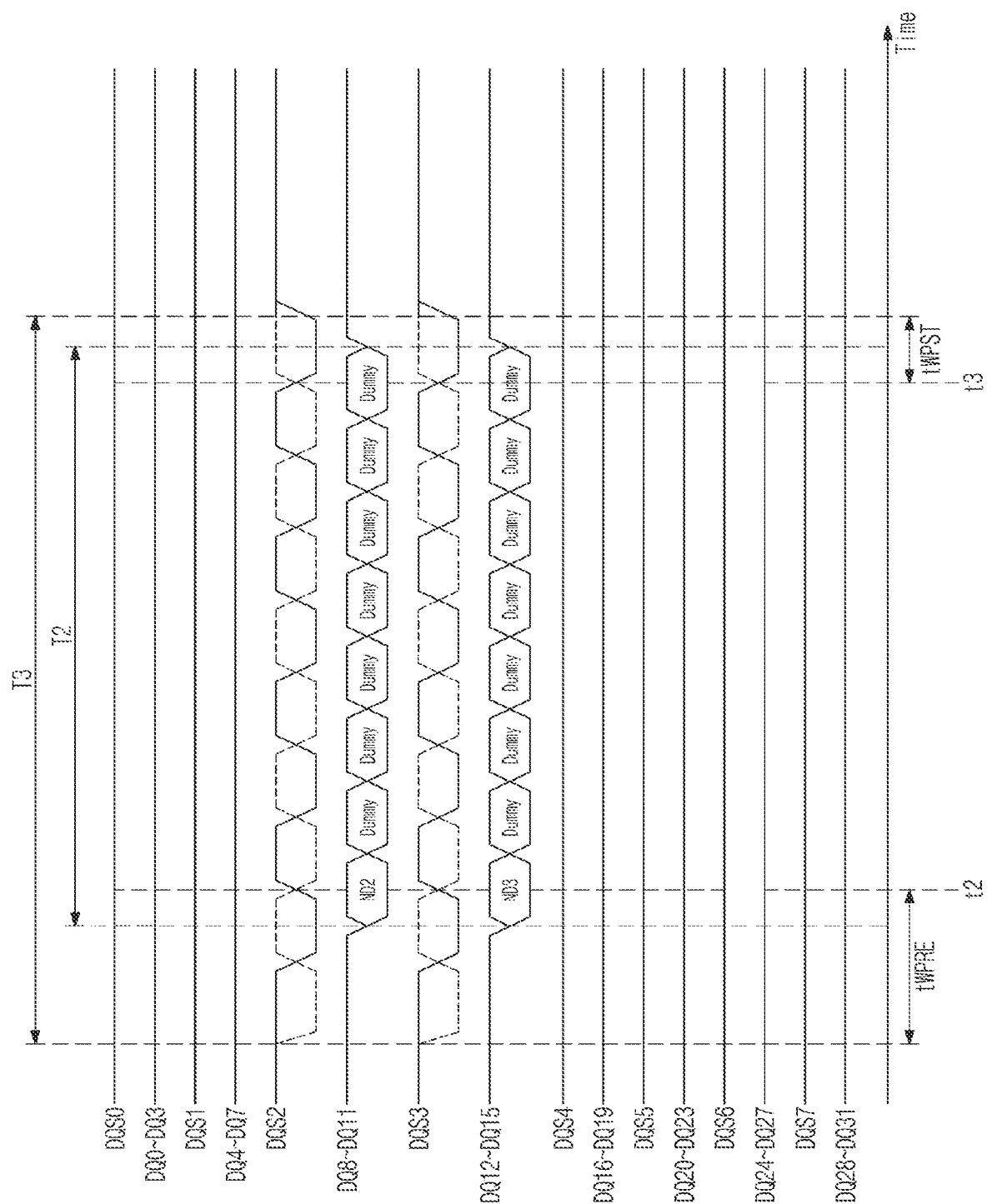
FIG. 12B is a timing diagram for describing a partial write operation of a memory system of FIG. 9.

FIG. 12B is a timing diagram for describing a partial write operation of a memory system of FIG. 9. The host 1100 may set the data strobe signal DQS, which is output to the non-target memory devices 1220, 1221, 1224, 1225, 1226, and 1227, to logic high "H" during the strobe toggle interval T3 and may not output even dummy data through the plurality of data lines DQ. The non-target memory devices 1220, 1221, 1224, 1225, 1226, and 1227 may receive the partial write command PWR and an address during the command/address input interval T1, may not receive input data during the data input interval T2, and may receive the data strobe signal DQS maintained at logic high "H" during the strobe toggle interval T3.

Like FIG. 11B, the host 1100 may provide the target memory devices 1222 and 1223 with the partial write command PWR and an address during the command/address input interval T1, may respectively provide the target memory devices 1222 and 1223 with the nibble data ND2 and ND3 during the data input interval T2, and may respectively provide the target memory devices 1222 and 1223 with the data strobe signals DQS2 and DQS3 toggling during the strobe toggle interval T3.

Figure 13A:
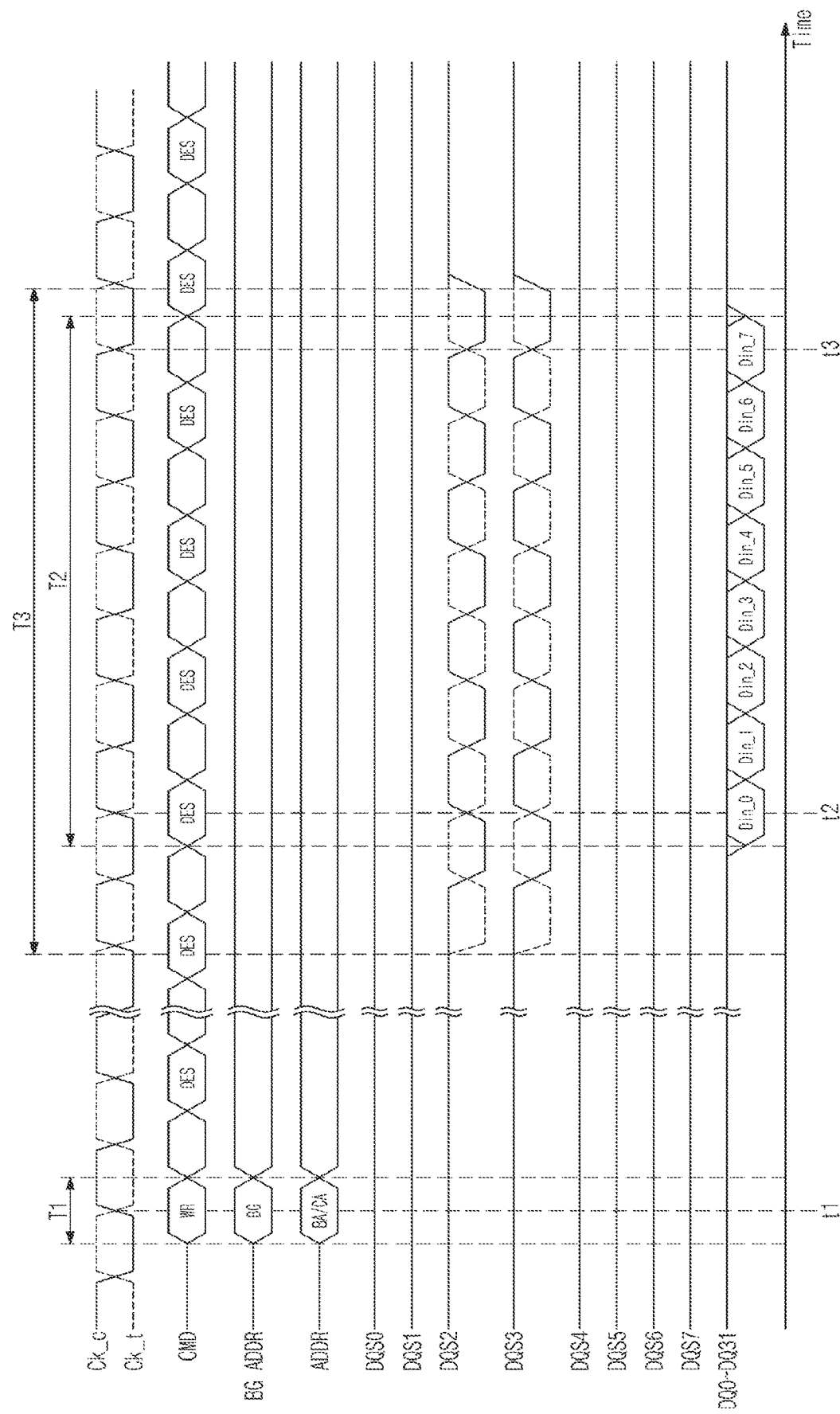
FIGS. 13A and 13B are timing diagrams for describing a partial write operation of a memory system according to the present disclosure.
Figure 13B:
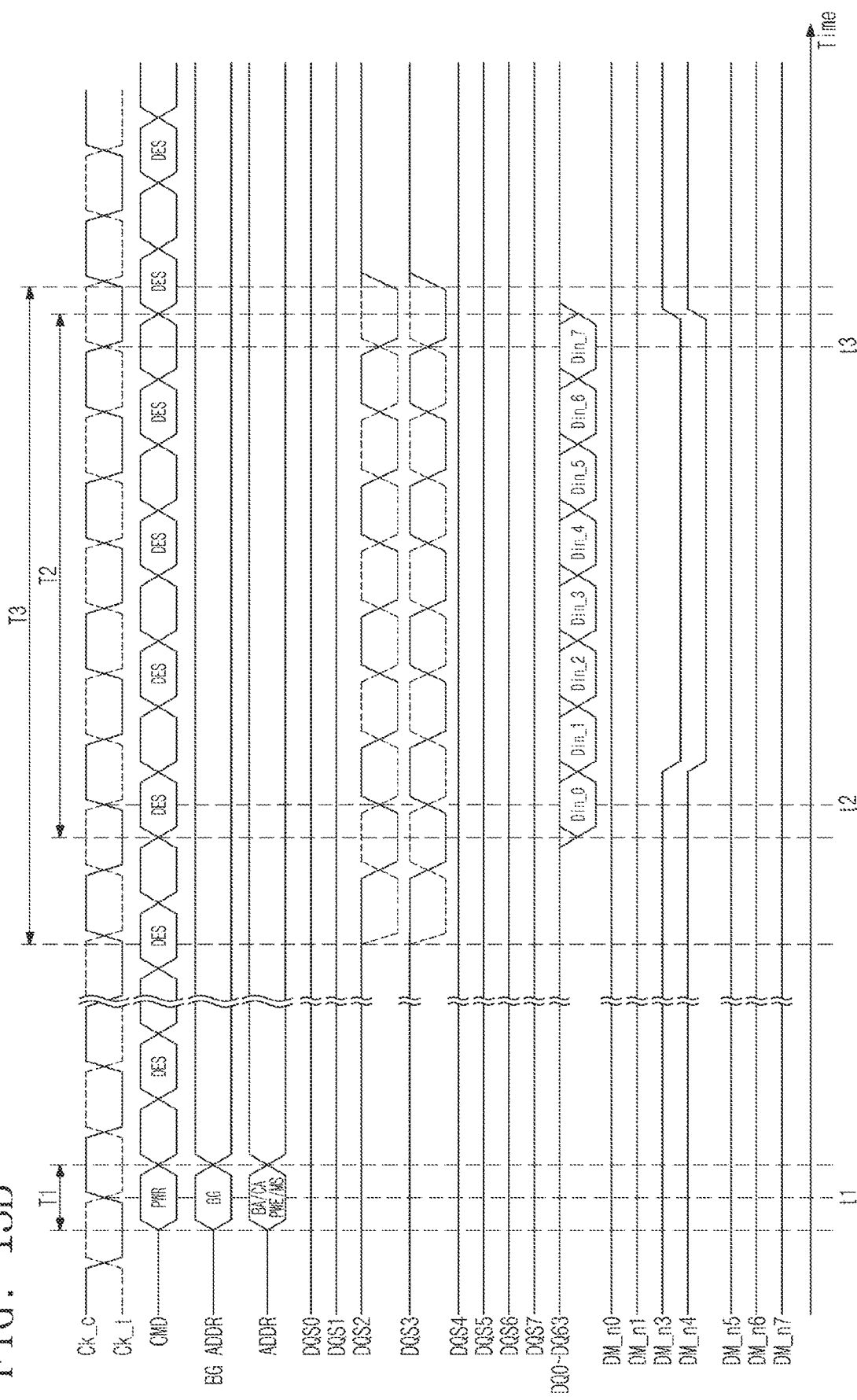

FIGS. 13A and 13B are timing diagrams for describing a partial write operation of a memory system according to the present disclosure. Referring to FIGS. 9 and 13A, the host 1100 may perform the partial write operation through the write command WR and the data strobe signal DQS. It is assumed that, during the 0-th to seventh burst lengths BL0 to BL7, the host 1100 output valid data to the second and third memory devices 1222 and 1223 and outputs dummy data to the remaining memory devices 1220, 1221, 1224, 1225, 1226, and 1227.

As illustrated in Table 1 and Table 2 above, during the command/address input interval T1, the host 1100 may control the command/address signal C/A to output the write command WR to the memory module 1200.

During the strobe toggle interval T3, the host 1100 may output the data strobe signal DQS toggling to the target memory devices 1222 and 1223. During the strobe toggle interval T3, the host 1100 may output the data strobe signal DQS maintained at logic high "H" to the non-target memory devices 1220, 1221, 1224, 1225, 1226, and 1227.

During the data input interval T2, the host 1100 may output valid data to the target memory devices 1222 and 1223. During the data input interval T2, the host 1100 may output dummy data to the non-target memory devices 1220, 1221, 1224, 1225, 1226, and 1227.

The target memory devices 1222 and 1223 may store the received input data in memory cells in response to the write command WR. During the strobe toggle interval T3, because receiving the data strobe signal DQS maintained at logic high "H", the non-target memory devices 1220, 1221, 1224, 1225, 1226, and 1227 may determine that the whole input data are dummy data. Because determining that the whole input data are dummy data, the non-target memory devices 1220, 1221, 1224, 1225, 1226, and 1227 may not store the whole input data in the memory cell array 120.

Referring to FIGS. 9 and 13B, the memory system 1000 may perform the partial write operation through the partial write command PWR, the data strobe signal DQS, and a data mask signal DM_n. Because the data mask signal DM_n is used, the plurality of memory devices 1220 to 1227 are assumed to be an X8 memory device. The memory system 1000 may perform the partial write operation in units of nibble by using the data mask signal DM_n and the partial write command PWR at the same time.

In an embodiment, the 0-th memory device 1220 may exchange data with the host 1100 through the 0-th to seventh data lines DQ0 to DQ7. The first memory device 1221 may exchange data with the host 1100 through eighth to fifteenth data lines DQ8 to DQ15. The second memory device 1222 may exchange data with the host 1100 through the sixteenth to twenty-third data lines DQ16 to DQ23. The third memory device 1223 may exchange data with the host 1100 through the twenty-fourth to thirty-first data lines DQ24 to DQ31. The fourth memory device 1224 may exchange data with the host 1100 through the thirty-second to thirty-ninth data lines DQ32 to DQ39. The fifth memory device 1225 may exchange data with the host 1100 through the fortieth to forty-seventh data lines DQ40 to DQ47. The sixth memory device 1226 may exchange data with the host 1100 through the forty-eighth to fifty-fifth data lines DQ48 to DQ55. The seventh memory device 1227 may exchange data with the host 1100 through the fifty-sixth to sixty-third data lines DQ56 to DQ63.

In an embodiment, the 0-th memory device 1220 may receive a 0-th data mask signal DM_n0 from the host 1100 through a 0-th data mask line, the first memory device 1221 may receive a first data mask signal DM_n1 from the host 1100 through a first data mask line, the second memory device 1222 may receive a second data mask signal DM_n2 from the host 1100 through a second data mask line, the third memory device 1223 may receive a third data mask signal DM_n3 from the host 1100 through a third data mask line, the fourth memory device 1224 may receive a fourth data mask signal DM_n4 from the host 1100 through a fourth data mask line, the fifth memory device 1225 may receive a fifth data mask signal DM_n5 from the host 1100 through a fifth data mask line, the sixth memory device 1226 may receive a sixth data mask signal DM_n6 from the host 1100 through a sixth data mask line, and the seventh memory device 1227 may receive a seventh data mask signal DM_n7 from the host 1100 through a seventh data mask line.

In an embodiment, the host 1100 may perform the partial write operation in units of nibble, by using the partial write command PWR and the data mask signals DM_n. For example, as illustrated in Table 3 and Table 4 above, during the command/address input interval T1, the host 1100 may control the command/address signal C/A to output the partial write command PWR to the memory module 1200. The host 1100 may send the partial write enable signal PWE and the plurality of mask signals MS to the memory module 1200.

In an embodiment, the plurality of mask signals MS may indicate whether to mask input data received through the 0-th to third data lines DQ0 to DQ3, the eighth to eleventh data lines DQ8 to DQ11, the sixteenth to nineteenth data lines DQ16 to DQ19, the twenty-fourth to twenty-seventh data lines DQ24 to DQ27, the thirty-second to thirty-fifth data lines DQ32 to DQ35, the fortieth to forty-third data lines DQ40 to DQ43, the forty-eighth to fifty-first data lines DQ48 to DQ51, and the fifty-sixth to fifty-ninth data lines DQ56 to DQ59, respectively.

Each of the data mask signals DM_n may indicate whether to mask input data received through the fourth to seventh data lines DQ4 to DQ7, the twelfth to fifteenth data lines DQ12 to DQ15, the twentieth to twenty-third lines DQ20 to DQ23, the twenty-eighth to thirty-first data lines DQ28 to DQ31, the thirty-sixth to thirty-ninth data lines DQ36 to DQ39, the forty-fourth to forty-seventh data lines DQ44 to DQ47, the fifty-second to fifty-fifth data lines DQ52 to DQ55, and the sixtieth to sixty-third data lines DQ60 to DQ63, respectively.

Each of the plurality of mask signals MS of FIG. 11B may indicate whether to mask the whole data input to each of memory devices, in one burst length. For example, in the 0-th memory device 1220, the 0-th mask signal MS0 may indicate whether to mask the 0-th nibble data ND0 input through the 0-th to third data lines DQ0 to DQ3 during the 0-th burst length BL0.

In contrast, each of the plurality of mask signals MS of FIG. 13B may indicate whether to mask a part of data input to each of memory devices, in one burst length. For example, in the 0-th memory device 1220, the 0-th mask signal MS0 may indicate whether to mask the 0-th nibble data ND0 input through the 0-th to third data lines DQ0 to DQ3 during the 0-th burst length BL0. The 0-th data mask signal DM_n0 input during the 0-th burst length BL0 may indicate whether to mask the first nibble data ND1 input through the fourth to seventh data lines DQ4 to DQ7 during the 0-th burst length BL0.

In the case where the memory system 1000 uses only the data mask signals DM_n, the memory system 1000 may perform the partial write operation in units of byte. The memory system 1000 according to an embodiment of the present disclosure may perform the partial write operation in units of nibble by using the data mask signals DM_n and the partial write command PWR.

Like FIG. 11B, the host 1100 may set data strobe signals corresponding to the non-target memory devices 1220, 1221, 1224, 1225, 1226, and 1227 to logic high "H" during the strobe toggle interval T3.

Figure 14:
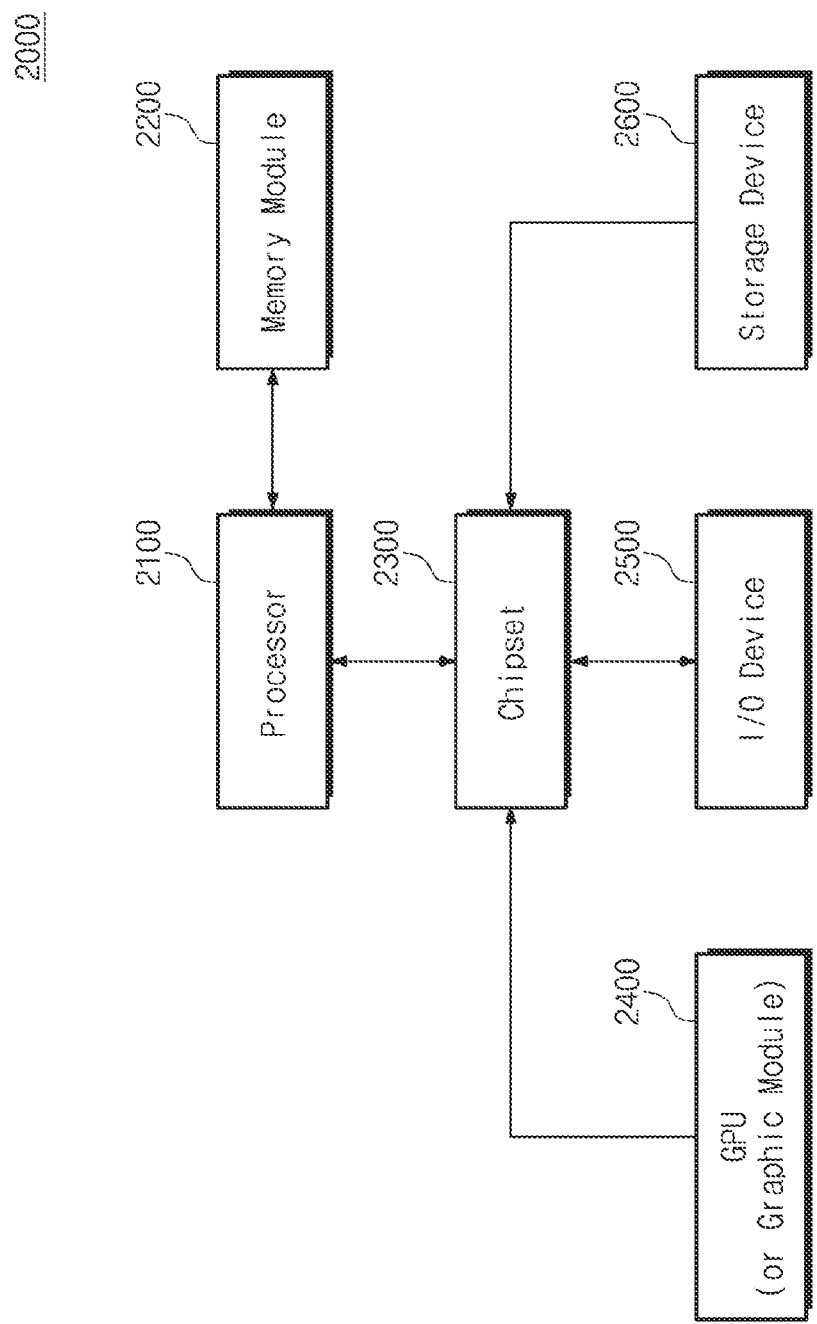
FIG. 14 is a block diagram illustrating a computing system to which a memory device according to the present disclosure is applied.

FIG. 14 is a block diagram illustrating a computing system 2000 to which a memory device according to the present disclosure is applied. Referring to FIG. 14, the computing system 2000 may include one of a computer, a portable computer, an ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, and various electronic devices including a home network.

The computing system 2000 may include a processor 2100, a memory module 2200, a chipset 2300, a graphic processing unit (GPU) (or a graphic module) 2400, an input/output device 2500, and a storage device 2600. The processor 2100 may perform overall operations of the computing system 2000. The processor 2100 may perform various operations in the computing system 2000.

The memory module 2200 may be directly connected with the processor 2100. For example, the memory module 2200 may be in the form of a dual in-line memory module (DIMM), and the memory module 2200 may be installed in a DIMM socket directly connected with the processor 2100 and may communicate with the processor 2100. In an embodiment, the memory module 2200 may include the memory device described with reference to FIGS. 1 to 8. The memory module 2200 that is the memory device described with reference to FIGS. 9 to 13 may perform the partial write operation.

The chipset 2300 may be electrically connected with the processor 2100 and may control hardware of the computing system 2000 under control of the processor 2100. For example, the chipset 2300 may be individually connected with the GPU 2400, the input/output device 2500, and the storage device 2600 through main buses and may perform a bridge operation of the main buses.

The GPU 2400 may perform a set of calculation operations for outputting image data of the computing system 2000. In an embodiment, the GPU 2400 may be embedded in the processor 2100 in the form of a system-on-chip. In an embodiment, the GPU 2400 may include the memory device or the memory module described with reference to FIGS. 1 to 13.

The input/output device 2500 includes various devices which input data or an instruction to the computing system 2000 or output data to an external device. The storage device 2600 may be used as a high-capacity storage medium of the computing system 2000. The storage device 2600 may include high-capacity storage media such as a hard disk drive (HDD), a solid-state drive (SSD), a memory card, and a memory stick.

Figure 15:
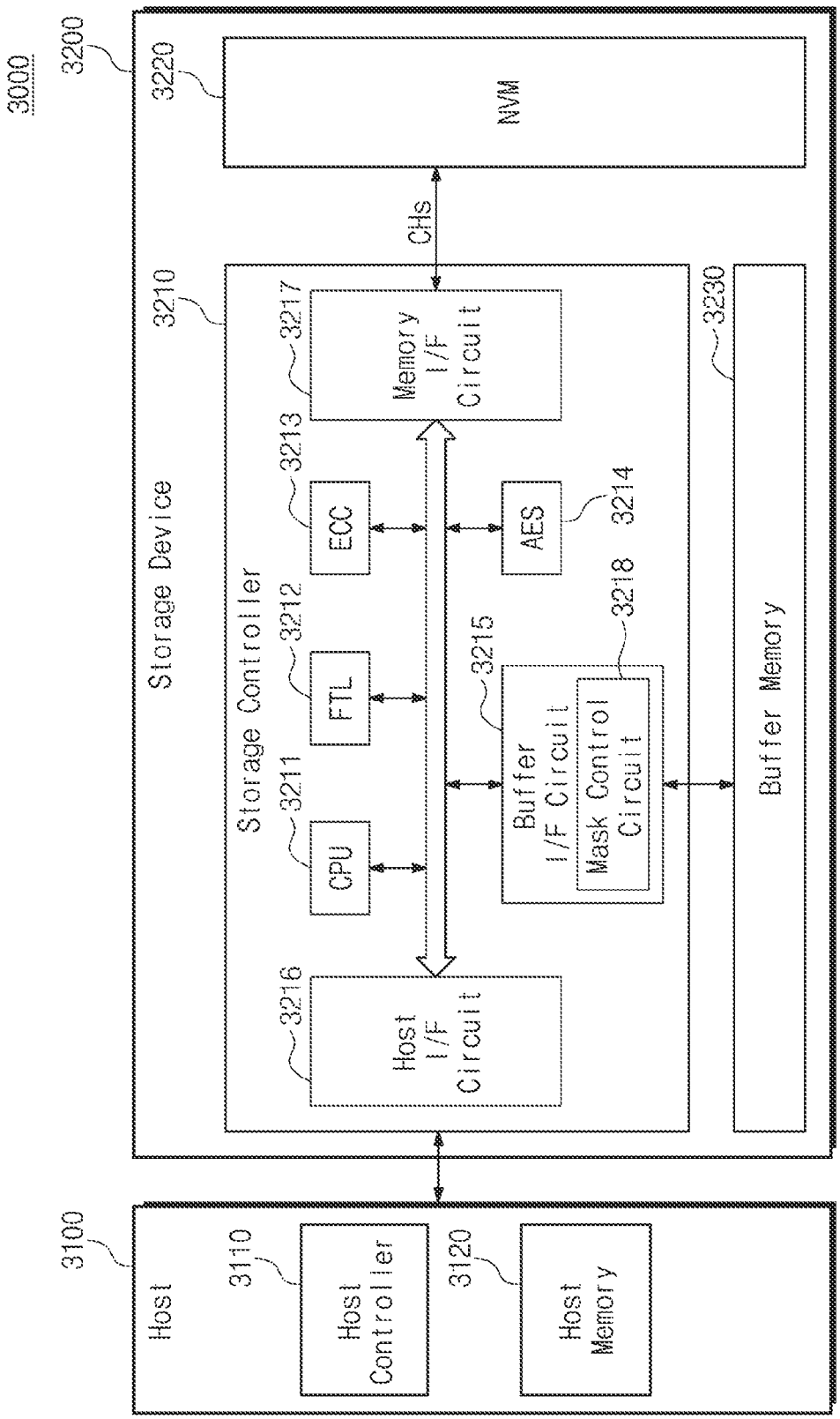
FIG. 15 is a block diagram illustrating a storage system according to an embodiment of the present disclosure.

FIG. 15 is a block diagram illustrating a storage system according to an embodiment of the present disclosure. Referring to FIG. 15, a storage system 3000 may include a host 3100 and a storage device 3200. In an embodiment, the storage system 3000 may be one of information processing devices, which are configured to process a variety of information and to store the processed information, such as a personal computer (PC), a laptop, a server, a workstation, a smartphone, a tablet PC, a digital camera, and a black box.

The host 3100 may control overall operations of the storage system 3000. For example, the host 3100 may send, to the storage device 3200, a request (RQ) for storing data "DATA" in the storage device 3200 or reading the data "DATA" stored in the storage device 3200. In an embodiment, the host 3100 may be a processor core, which is configured to control the storage system 3000, such as a central processing unit (CPU) or an application processor or may be a computing node connected through a network.

In an embodiment, the host 3100 may include a host controller 3110 and a host memory 3120. The host controller 3110 may be a device configured to control overall operations of the host 3100 or to allow the host 3100 to control the storage device 3200. The host memory 3120 may be a buffer memory, a cache memory, or a working memory that is used in the host 3100.

The storage device 3200 may operate under control of the host 3100. The storage device 3200 may include a storage controller 3210, a nonvolatile memory device 3220, and a buffer memory 3230. Under control of the host 3100, the storage controller 3210 may store data in the nonvolatile memory device 3220 or may read data stored in the nonvolatile memory device 3220. In an embodiment, the storage controller 3210 may perform various management operations for efficiently using the nonvolatile memory device 3220.

The storage controller 3210 may include a central processing unit (CPU) 3211, a flash translation layer (FTL) 3212, an error correction code (ECC) engine 3213, an advanced encryption standard (AES) engine 3214, a buffer interface circuit 3215, a host interface circuit 3216, and a memory interface circuit 3217.

The CPU 3211 may perform overall operations of the storage controller 3210. The FTL 3212 may perform various operations for efficiently using the nonvolatile memory device 3220. For example, the host 3100 may manage a storage space of the storage device 3200 by using logical addresses. The FTL 3212 may be configured to manage address mapping between a logical address from the host 3100 and a physical address of the storage device 3200. The FTL 3212 may perform a wear-leveling operation to prevent excessive degradation of a specific memory block among memory blocks of the nonvolatile memory device 3220. A lifetime of the nonvolatile memory device 3220 may be improved by the wear-leveling operation of the FTL 3212. The FTL 3212 may perform a garbage collection operation on the nonvolatile memory device 3220 to secure a free memory block.

In an embodiment, the FTL 3212 may be implemented in the form of hardware or software. In the case where the FTL 3212 is implemented in the form of software, a program code or information associated with the FTL 3212 may be stored in the buffer memory 3230 or a cache memory (e.g., an SRAM) (not illustrated) and may be executed by the CPU 3211. In the case where the FTL 3212 is implemented in the form of hardware, a hardware accelerator configured to perform an operation of the FTL 3212 may be provided independently of the CPU 3211.

The ECC engine 3213 may perform error detection and correction on data read from the nonvolatile memory device 3220. For example, the ECC engine 3213 may generate an error correction code (or a parity bit(s)) for data to be written in the nonvolatile memory device 3220. The error correction code (or parity bit(s)) thus generated may be stored in the nonvolatile memory device 3220 together with the data to be written. Afterwards, when the written data are read from the nonvolatile memory device 3220, the ECC engine 3213 may detect and correct an error of the read data based on the read data and the corresponding error correction code (or the corresponding parity bit(s)).

The AES engine 3214 may perform an encryption operation on data received from the host 3100 or may perform a decryption operation on data received from the nonvolatile memory device 3220. In an embodiment, the encryption operation and the decryption operation may be performed based on a symmetric-key algorithm.

The buffer interface circuit 3215 may be configured to communicate with the buffer memory 3230 in compliance with the predefined communication protocol. In an embodiment, the predefined interface protocol may include at least one of various interface protocols such as a double data rate (DDR), a low-power DDR (LPDDR), and a universal serial bus (USB). The buffer interface circuit 3215 may send a signal, which is based on the predefined interface protocol, to the buffer memory 3230. The buffer interface circuit 3215 may receive a signal, which is based on the predefined interface protocol, from the buffer memory 3230.

In response to a request from the CPU 3211 or a direct memory access (DMA) engine, the buffer interface circuit 3215 may store data in the buffer memory 3230 or may read the stored data. The buffer interface circuit 3215 may send the command/address signal C/A to the buffer memory 3230. The buffer interface circuit 3215 may exchange data with the buffer memory 3230 through the plurality of data lines DQ. The buffer interface circuit 3215 may exchange the data strobe signal DQS with the buffer memory 3230.

The buffer interface circuit 3215 may receive a read or write request from the CPU 3211 in units of byte or nibble, as well as in units of cache line. The buffer interface circuit 3215 may perform the partial write operation with the buffer memory 3230.

In an embodiment, the buffer interface circuit 3215 may include a mask control circuit 3218. The mask control circuit 3218 may control the plurality of mask signals MS, the partial write enable signal PWE, and the data strobe signal DQS in response to a partial write request received from the CPU 3211.

The mask control circuit 3218 may send the partial write command PWR to the buffer memory 3230. The mask control circuit 3218 may output the partial write enable signal PWE through the twelfth address line A12 in the command/address input interval. In the command/address input interval, the mask control circuit 3218 may output the 0-th mask signal MS0 through the 0-th address line A0, may output the first mask signal MS1 through the first address line A1, may output the second mask signal MS2 through the second address line A2, may output the third mask signal MS3 through the eleventh address line A11, may output the fourth mask signal MS4 through the thirteenth address line A13, may output the fifth mask signal MS5 through the 0-th chip identifier line C0, may output the sixth mask signal MS6 through the first chip identifier line C1, and may output the seventh mask signal MS7 through the second chip identifier line C2.

The mask control circuit 3218 may generate a plurality of mask signals. The mask control circuit 3218 may set a mask signal corresponding to a burst length of input data including valid data so as to indicate the disable state and may set a mask signal corresponding to a burst length of input data including only dummy data (i.e., input data in which valid data are not included) so as to indicate the enable state. The plurality of mask signals may indicate a location of valid data among data input to the buffer memory 3230 during the whole burst length.

For example, in the case where the mask control circuit 3218 outputs the first byte data BD1 to the buffer memory 3230 during the 0-th burst length BL0, during the command/address input interval, the mask control circuit 3218 may set the 0-th mask signal MS0 to logic low "L" and may set the remaining mask signals MS1 to MS7 to logic high "H".

The mask control circuit 3218 may send the data strobe signal DQS indicating whether data are valid, to the buffer memory 3230. During the strobe toggle interval T3, the data strobe signal DQS connected with a target memory device may toggle under control of the mask control circuit 3218. The mask control circuit 3218 may set the data strobe signal DQS connected with a non-target memory device to logic high "H" during the strobe toggle interval T3.

To update data in units of nibble or byte, the mask control circuit 3218 may receive an address and data from the CPU 3211. The mask control circuit 3218 may receive an address and data, which correspond to a byte unit, from the CPU 3211. Below, as illustrated in FIG. 2B, it is assumed that the mask control circuit 3218 updates data stored in the first memory cell group MCG1.

The mask control circuit 3218 may generate the third data DT3 based on data received from the CPU 3211. The mask control circuit 3218 may generate the third data DT3 by using the data received from the CPU 3211 as the first byte data BD1 and adding dummy data. The mask control circuit 3218 may generate the third data DT3 which include the first byte data BD1 having a valid value and the 0-th and second to thirty-first byte data BD0 and BD2 to BD31 each having a dummy value. For example, the dummy value may refer to a given value or a random value. The mask control circuit 3218 may send the third data DT3 to the buffer memory 3230 through the plurality of data lines DQ.

The buffer memory 3230 may be a write buffer or a read buffer configured to temporarily store data input to the storage controller 3210. Alternatively, the buffer memory 3230 may be configured to store a variety of information necessary for the storage controller 3210 to operate. For example, the buffer memory 3230 may store a mapping table that is managed by the FTL 3212. Alternatively, the buffer memory 3230 may store software, firmware, or information that is associated with the FTL 3212.

The buffer memory 3230 may operate under control of the buffer interface circuit 3215. For example, in response to signals received from the buffer interface circuit 3215, the buffer memory 3230 may store data or may provide the stored data to the buffer interface circuit 3215. In an embodiment, the buffer memory 3230 may be a dynamic random access memory (DRAM) device, but the present disclosure is not limited thereto. The buffer memory 3230 may perform the partial write operation described with reference to FIGS. 1 to 14.

The host interface circuit 3216 may communicate with the host 3100 in compliance with the predefined interface protocol. In an embodiment, the predefined interface protocol may include at least one of protocols for various interfaces such as an ATA (Advanced Technology Attachment) interface, an SATA (Serial ATA) interface, an e-SATA (external SATA) interface, an SCSI (Small Computer Small Interface) interface, an SAS (Serial Attached SCSI) interface, a PCI (Peripheral Component Interconnection) interface, a PCIe (PCI express) interface, an NVMe (NVM express) interface, an IEEE 1394 interface, an USB (Universal Serial Bus) interface, an SD (Secure Digital) card interface, an MMC (Multi-Media Card) interface, an eMMC (embedded Multi-Media Card) interface, an UFS (Universal Flash Storage) interface, an eUFS (embedded Universal Flash Storage) interface, a CF (Compact Flash) card interface, or a network interface. The host interface circuit 3216 may receive a signal, which is based on the predefined interface protocol, from the host 3100 and may operate based on the received signal. Alternatively, the host interface circuit 3216 may send a signal, which is based on the predefined interface protocol, to the host 3100.

The memory interface circuit 3217 may communicate with the nonvolatile memory device 3220 in compliance with the predefined communication protocol. In an embodiment, the predefined interface protocol may include at least one of protocols for various interfaces such as a toggle interface and an open NAND flash interface (ONFI). In an embodiment, the memory interface circuit 3217 may communicate with the nonvolatile memory device 3220 based on the toggle interface. In this case, the memory interface circuit 3217 may communicate with the nonvolatile memory device 3220 through a plurality of channels CHs. In an embodiment, each of the plurality of channels CHs may include a plurality of signal lines configured to transfer various control signals (e.g., /CE, CLE, ALE, /WE, /RE, and R/B), data signals, and a data strobe signal.

Figure 16:
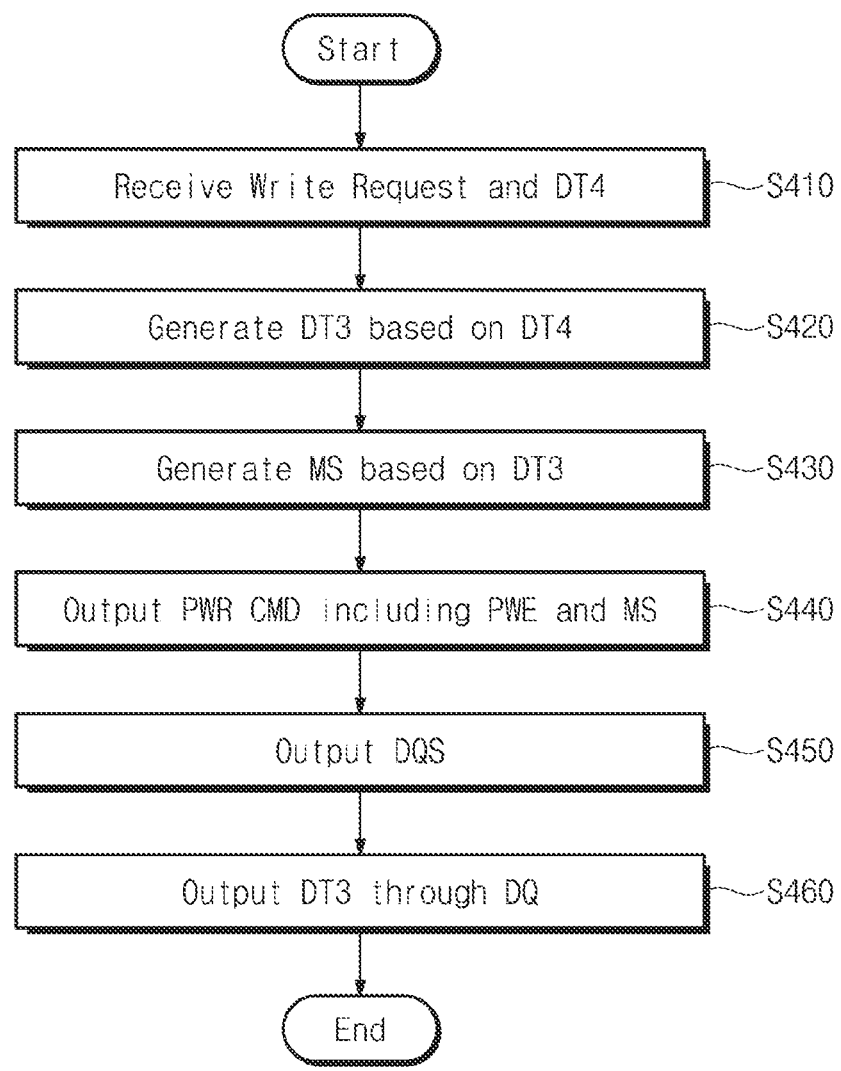
FIG. 16 is a flowchart illustrating an operation of a mask control circuit of FIG. 15.

FIG. 16 is a flowchart illustrating an operation of a mask control circuit of FIG. 15. Referring to FIGS. 15 and 16, in operation S410, the mask control circuit 3218 may receive a write request and fourth data DT4 from the CPU 3211 or a DMA engine (not illustrated). The fourth data DT4 may be data of a nibble unit or a byte unit smaller than a cache line unit. Below, it is assumed that the fourth data DT4 are data of a byte unit. For example, it is assumed that the write request includes a write command and an address and the address indicates the first memory cell group MCG1 of FIG. 2B.

In operation S420, the mask control circuit 3218 may generate the third data DT3 based on the fourth data DT4. The mask control circuit 3218 may generate the third data DT3 by using the fourth data DT4 of the byte unit as the first byte data BD1 and adding dummy data.

In operation S430, the mask control circuit 3218 may generate the plurality of mask signals MS based on the third data DT3. Because the first byte data BD1 being valid are included in the 0-th input data Din_0, the mask control circuit 3218 may set the 0-th mask signal MS0 to logic low "L" and may set the remaining mask signals MS1 to MS7 to logic high "H".

In operation S440, the mask control circuit 3218 may output, to the buffer memory 3230, the partial write command PWR including the partial write enable signal PWE and the plurality of mask signals MS during the command/address input interval. For example, the mask control circuit 3218 may output the partial write enable signal PWE indicating the enable state through the twelfth address line A12 during the command/address input interval.

In the command/address input interval, the mask control circuit 3218 may output the 0-th mask signal MS0 indicating the disable state through the 0-th address line A0, may output the first mask signal MS1 indicating the enable state through the first address line A1, may output the second mask signal MS2 indicating the enable state through the second address line A2, may output the third mask signal MS3 indicating the enable state through the eleventh address line A11, may output the fourth mask signal MS4 indicating the enable state through the thirteenth address line A13, may output the fifth mask signal MS5 indicating the enable state through the 0-th chip identifier line C0, may output the sixth mask signal MS6 indicating the enable state through the first chip identifier line C1, and may output the seventh mask signal MS7 indicating the enable state through the second chip identifier line C2.

In operation S450, the mask control circuit 3218 may output the data strobe signal DQS to the buffer memory 3230 during the strobe toggle interval. In the case where the buffer memory 3230 includes a plurality of memory devices as illustrated in FIG. 9, during the strobe toggle interval, the mask control circuit 3218 may output the data strobe signal DQS toggling to a target memory device and may output the data strobe signal DQS maintained at logic high "H" to a non-target memory device.

In operation S460, the mask control circuit 3218 may output the third data DT3 to the buffer memory 3230 through the plurality of data lines DQ. In the case where the buffer memory 3230 includes a plurality of memory devices as illustrated in FIG. 9, the mask control circuit 3218 may output data to a target memory device and a non-target memory device. Also, the mask control circuit 3218 may output data to a target memory device and may not output data to a non-target memory device.

As described above, a memory system may perform the partial write operation. A host may send a plurality of mask signals and a partial write enable signal to a memory device during a command/address input interval by using a command/address signal without using a separate data mask signal. The memory device may store all or a part of input data in memory cells based on the plurality of mask signals and the data strobe signal, in response to the partial write command.

According to the present disclosure, a partial write operation may be performed by sending a plurality of mask signals to a memory device through a command/address line. Accordingly, an electronic device, an operation method of a host, an operation method of a memory module, and an operation method of a memory device, which are capable of minimizing power consumption, are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a memory module which includes a plurality of memory devices, the method comprising:
receiving a partial write command including a partial write enable signal and a plurality of mask signals, at a first time;
during a strobe toggle interval after the first time, receiving a first data strobe signal toggling through a first data strobe line connected with a first memory device, among the plurality of memory devices, and receiving a second data strobe signal maintained at logic high through a second data strobe line connected with a second memory device, among the plurality of memory devices; and
receiving a plurality of data through a plurality of data lines, during a data input interval after the first time.

2. The method of claim 1, further comprising storing a part of the plurality of data in a plurality of memory cells included in the first memory device based on the plurality of mask signals, in response to the partial write enable signal.

3. The method of claim 2, wherein:
the plurality of mask signals include a first mask signal and a second mask signal, the first mask signal corresponds to first input data that is input during a first burst length and the second mask signal corresponds to second input data that is input during a second burst length, the storing of the part of the plurality of data in the plurality of memory cells included in the first memory device based on the plurality of mask signals, in response to the partial write enable signal, includes:

when the first mask signal is in a disable state, storing a part of the first input data in the plurality of memory cells included in the first memory device; and when the second mask signal is in an enable state, not storing the second input data in the plurality of memory cells included in the first memory device.

4. The method of claim 3, wherein:

the storing of the part of the first input data in the plurality of memory cells included in the first memory device, when the first mask signal is in the disable state, includes:

enabling a first column selection line corresponding to a first column address of the first input data; and storing the first input data in the plurality of memory cells included in the first memory device in response to the first column selection line, and the not storing the second input data in the plurality of memory cells included in the first memory device, when the second mask signal is in the enable state, includes:

disabling a second column selection line corresponding to a second column address of the second input data; and not storing the second input data in the plurality of memory cells included in the first memory device in response to the second column selection line.

5. The method of claim 1, wherein the receiving of the plurality of data through the plurality of data lines, during the data input interval after the first time, includes:

receiving data including valid data through first data lines connected with the first memory device among the plurality of data lines; and receiving dummy data through second data lines connected with the second memory device among the plurality of data lines.

6. The method of claim 5, wherein:

the plurality of mask signals include a first mask signal and a second mask signal, when the first mask signal corresponds to first input data that is input during a first burst length, the second mask signal corresponds to second input data that is input during a second burst length, the first mask signal indicates a disable state, and the second mask signal indicates an enable state, and receiving data including valid data through first data lines connected with the first memory device includes:

receiving first input data that is valid, during a first burst length; and receiving second input data that is dummy data, during a second burst length.

7. The method of claim 1, wherein the receiving of the plurality of data through the plurality of data lines, during the data input interval after the first time, includes:

receiving the plurality of data through first data lines connected with the first memory device among the plurality of data lines; and when another command is not received, not receiving data through second data lines connected with the second memory device among the plurality of data lines.

8. The method of claim 1, wherein the receiving of the partial write command including the partial write enable signal and the plurality of mask signals includes receiving the partial write enable signal and the plurality of mask signals through reserved lines among command/address lines.

9. The method of claim 1, wherein the receiving of the partial write command including the partial write enable signal and the plurality of mask signals includes:

receiving 0-th to second mask signals among the plurality of mask signals through 0-th to second address lines;

receiving a third mask signal among the plurality of mask signals through an eleventh address line;

receiving a fourth mask signal among the plurality of mask signals through a thirteenth address line;

receiving fifth to seventh mask signals among the plurality of mask signals through 0-th to second chip identifier lines; and receiving the partial write enable signal through a twelfth address line.

10. The method of claim 1, wherein:

the data input interval starts from a second time being a time at which a write latency (WL) passes from the first time and ends at a third time, and the strobe toggle interval starts before a write preamble latency from the second time and ends after a postamble latency passes from the third time.

* * * * *